(12) United States Patent
Yutani et al.

(10) Patent No.: US 11,640,982 B2
(45) Date of Patent: May 2, 2023

(54) SEMICONDUCTOR DEVICE

(71) Applicant: ROHM CO., LTD., Kyoto (JP)

(72) Inventors: Masatsugu Yutani, Kyoto (JP); Yuki Shiraishi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 117 days.

(21) Appl. No.: 17/375,950

(22) Filed: Jul. 14, 2021

(65) Prior Publication Data

US 2022/0037488 A1 Feb. 3, 2022

(30) Foreign Application Priority Data

Jul. 31, 2020 (JP) .............................. JP2020-130207

(51) Int. Cl.
*H01L 29/423* (2006.01)
*H01L 29/417* (2006.01)
*H01L 29/66* (2006.01)
*H01L 29/40* (2006.01)
*H01L 29/78* (2006.01)
H01L 29/739 (2006.01)

(52) U.S. Cl.
CPC ...... *H01L 29/42368* (2013.01); *H01L 29/407* (2013.01); *H01L 29/41741* (2013.01); *H01L 29/4236* (2013.01); *H01L 29/66727* (2013.01); *H01L 29/66734* (2013.01); *H01L 29/7813* (2013.01); *H01L 29/7397* (2013.01)

(58) Field of Classification Search
CPC ......... H01L 29/42368; H01L 29/41741; H01L 29/66727; H01L 29/66734; H01L 29/7813; H01L 29/7397; H01L 29/4236; H01L 29/66333; H01L 29/66348; H01L 29/7827; H01L 27/2454

See application file for complete search history.

(56) References Cited

U.S. PATENT DOCUMENTS

2017/0330942 A1* 11/2017 Henson ............... H01L 29/7801

FOREIGN PATENT DOCUMENTS

| JP | 2006520091 A | | 8/2006 | |
| JP | 2017162992 A | * | 9/2017 | ......... H01L 23/5283 |
| JP | 2020191409 A | * | 11/2020 | ........... H01L 21/046 |

* cited by examiner

*Primary Examiner* — Joseph C. Nicely
(74) *Attorney, Agent, or Firm* — Hamre, Schumann, Mueller & Larson, P.C.

(57) ABSTRACT

The present disclosure provides a semiconductor device. The semiconductor device includes a semiconductor chip having a first main surface including an active region and a peripheral region surrounding the active region; a first trench formed in the active region; a first insulating film formed on an inner surface of the first trench; a first electrode formed in the first trench interfacing the first insulating film, and forming a channel in a portion of the semiconductor chip facing the first insulating film; a second trench formed in the peripheral region and having a width greater a width of the first trench; a second insulating film formed on an inner surface of the second trench; and a second electrode formed in the second trench interfacing the second insulating film and electrically coupled to the first electrode.

16 Claims, 21 Drawing Sheets

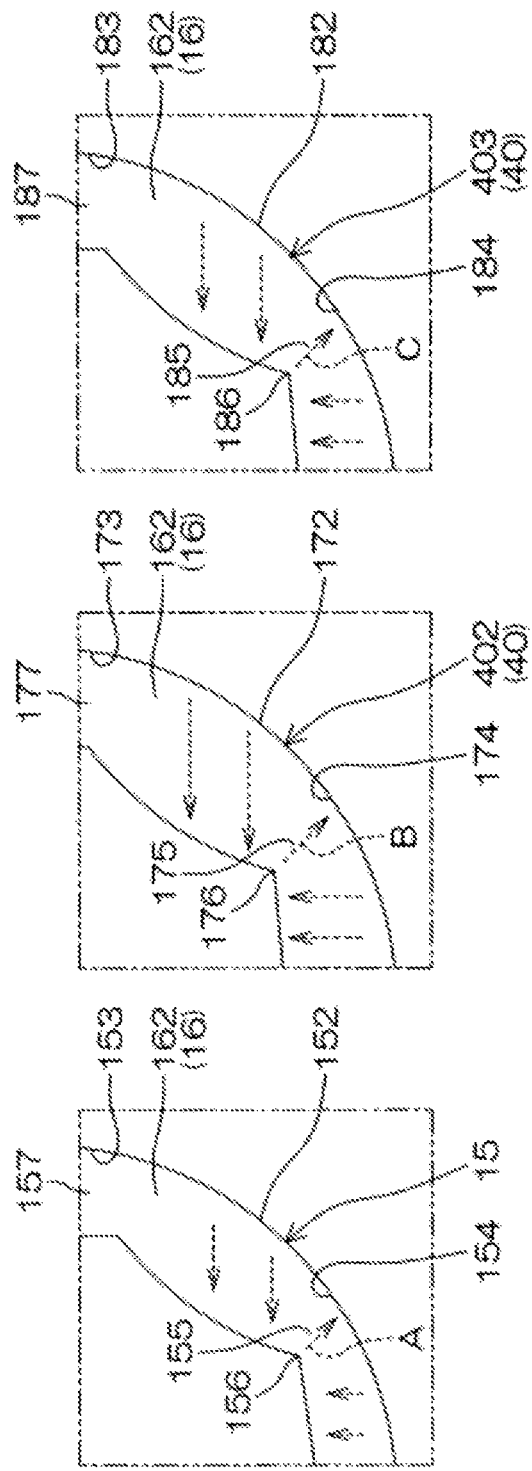

SEMICONDUCTOR DEVICE

BACKGROUND OF THE INVENTION

Field of the Invention

The present disclosure relates to a semiconductor device.

Description of the Prior Art

For example, patent document 1 discloses a trench gate vertical metal-oxide semiconductor field-effect transistor (MOSFET), including: an epitaxial layer, formed with an active unit array and a gate bus region; a gate trench, formed in the active unit array; a gate oxide film, formed in the gate trench; a gate electrode, including polycrystalline silicon embedded in the gate trench; a trench, formed in the gate bus region, and connected to the gate trench; and a gate bus, including polycrystalline silicon that is embedded in the trench in manner of covering the surface of the epitaxial layer in the gate bus region.

PRIOR ART DOCUMENT

Patent Publication

[Patent document 1] Japan Patent Publication No. 2006-520091

SUMMARY OF THE INVENTION

Technical Means for Solving the Problem

A semiconductor device according to an embodiment of the disclosure includes: a semiconductor chip, having a first main surface including an active region and a peripheral region surrounding the active region; a first trench, formed in the active region; a first insulating film, formed on an inner surface of the first trench; a first electrode, formed in the first trench interfaced with the first insulating film, and forming a channel in a portion of the semiconductor chip facing the interfacing first insulating film; a second trench, formed in the peripheral region and having a width greater a width of the first trench, the second trench extending in a first direction and a second direction intersecting the first direction, the second trench having a corner portion curved from the first direction to the second direction; a second insulating film, formed on an inner surface of the second trench; and a second electrode, formed in the second trench interfaced with the second insulating film, and electrically coupled to the first electrode. The first insulating film has a first thin portion, which is formed at a bottom portion of the first trench and is selectively thinner than other parts of the first insulating film; the second insulating film has a second thin portion, which is formed at a bottom portion of the corner portion of the second trench and is thinner than other parts of the second insulating film and thicker than the first thin portion.

BRIEF DESCRIPTION OF THE DRAWINGS

FIG. 21A to FIG. 21C are diagrams of related steps for forming first to third thin portions, respectively.

DETAILED DESCRIPTION OF THE EMBODIMENTS

Embodiments of the Disclosure

Figure 1:
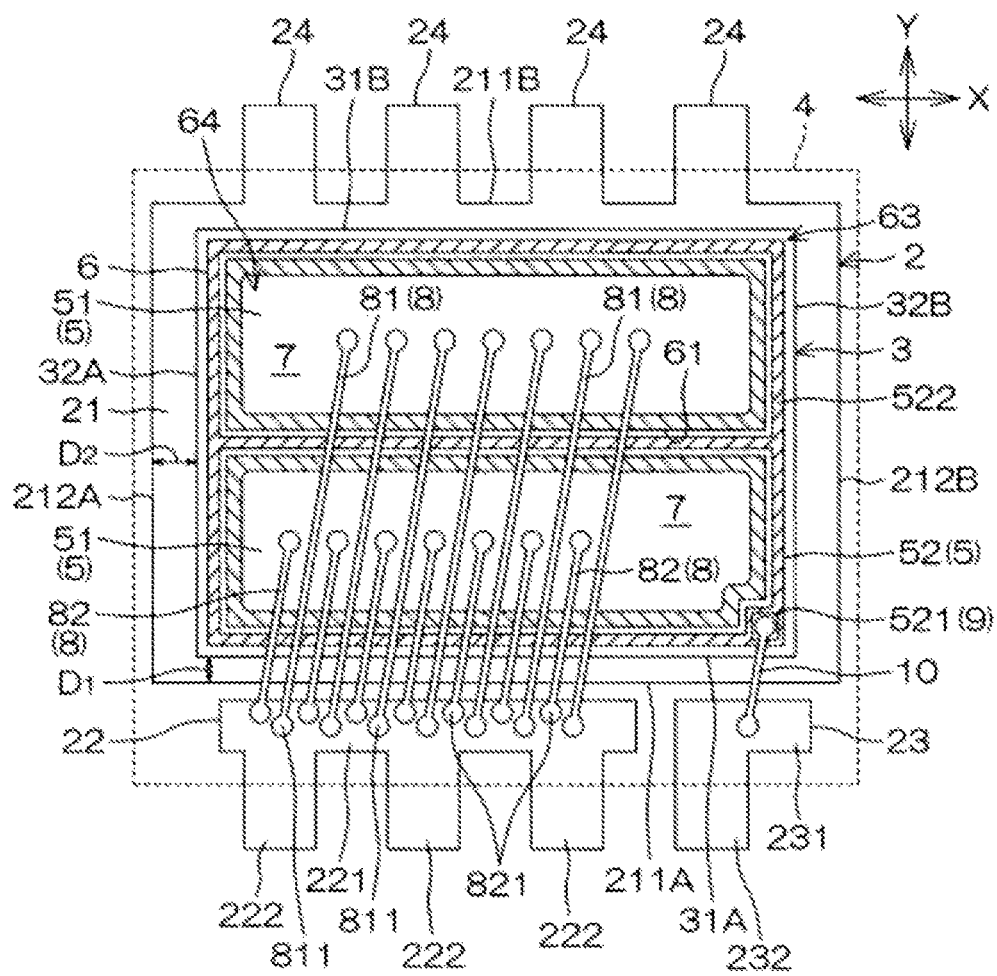
FIG. 1 is a schematic top view of a semiconductor device according to an embodiment of the disclosure.

First of all, some embodiments of the disclosure are described below.

A semiconductor device according to an embodiment of the disclosure includes: a semiconductor chip, having a first main surface including an active region and a peripheral region surrounding the active region; a first trench, formed in the active region; a first insulating film, formed on an inner surface of the first trench; a first electrode, formed in the first trench interfaced with the first insulating film, and forming a channel in a portion of the semiconductor chip facing the interfacing first insulating film; a second trench, formed in the peripheral region and having a width greater a width of the first trench, the second trench extending in a first direction and a second direction intersecting the first direction, the second trench having a corner portion curved from the first direction to the second direction; a second insulating film, formed on an inner surface of the second trench; and a second electrode, formed in the second trench interfaced with the second insulating film, and electrically coupled to the first electrode. The first insulating film has a first thin portion, which is formed at a bottom portion of the first trench and is selectively thinner than other parts of the first insulating film; the second insulating film has a second thin portion, which is formed at a bottom portion of the corner portion of the second trench and is thinner than other parts of the second insulating film and thicker than the first thin portion.

According to the configuration, the width of the second trench is greater than the width of the first trench, and so the material gas for forming the second insulating film can be spread throughout the inside of the second trench in the step of forming the second insulating film. Thus, the second insulating film can be formed efficiently on the inner surface of the second trench. For example, when the first insulating film and the second insulating film are formed using the same step, the second insulating film can be formed at a film forming speed (second film forming speed) faster than a film forming speed (first film forming speed) of the first insulating film with respect to the inner surface of the first trench. As a result, for example, in the stage in which the film thickness of the first insulating film reaches a predetermined designed thickness based on target conduction characteristics by supplying the material gas, the second thin portion of the second insulating film can be formed as being relatively thicker. For example, the second thin portion of the second insulating film can be formed as being relatively thicker than the first thin portion of the first insulating film as a result.

Thus, in the corner portion of the second trench where the electric field is likely to be gathered in the semiconductor chip, the resistance to insulation damage of the second insulating film (the second thin portion) can be enhanced. On the other hand, by forming the first insulating film at a film forming speed slower than that of the second insulating film instead of forming the first insulating layer and the second insulating layer to both be thicker, the film thickness of the first insulating film is kept at the designed film thickness. As a result, the increase in the conduction resistance of components caused by thickening of the second thin portion can be prevented. That is, the semiconductor device according to an embodiment of the disclosure can prevent any degraded conduction characteristics of components and at the same time enhance the reliability against insulation damage.

In the semiconductor device according to an embodiment of the disclosure, the first insulating film may include a first thin concave portion. The first thin concave portion is selectively recessed at a bottom portion of the first trench in a direction approaching the inner surface of the first trench, and may be sandwiched between the first thin concave portion and the inner surface of the first trench.

In the semiconductor device according to an embodiment of the disclosure, the second insulating film may include a second thin concave portion. The second thin concave portion is selectively recessed at a bottom portion of the corner portion of the second trench in a direction approaching the inner surface of the second trench, and may be sandwiched between the second thin concave portion and the inner surface of the second trench.

The semiconductor device according to an embodiment of the disclosure may include: a connection trench, straddling between the active region and the peripheral region, and connecting the first trench and the second trench; and a connection electrode, formed in the connection trench, and connecting the first electrode and the second electrode.

The semiconductor device according to an embodiment of the disclosure may include: an interlayer insulating film, formed on the semiconductor chip and covering the first trench and the second trench; a surface electrode, formed on the interlayer insulating film; and a contact portion, formed in the interlayer insulating film and connecting the surface electrode and the second electrode.

In the semiconductor device according to an embodiment of the disclosure, the connection trench may include: a first connection trench, connected to the second trench at a first connection point; and a second connection trench, connected to the second trench at a second connection point separated from the first connection point; wherein the contact portion may be connected to the second electrode at a part of the second trench between the first connection point and the second connection point.

In the semiconductor device according to an embodiment of the disclosure, when the second electrode includes an embedded electrode embedded in the second trench, a contact hole may be included. The contact hole penetrates the interlayer insulating film and reaches an intermediate portion of the second electrode in a depth direction of the second trench. In this case, the contact portion may include a contact plug embedded in the contact hole.

The semiconductor device according to an embodiment of the disclosure may further include a barrier film. The barrier film is formed between the contact plug and an inner surface of the contact hole to prevent contact among the contact plug, the interlayer insulating film and the second electrode.

In the semiconductor device according to an embodiment of the disclosure, the surface electrode may include: a pad electrode portion, covering the active region and configured to be electrically coupled to the channel; and a finger electrode portion, formed to surround the pad electrode portion and electrically coupled to the second electrode through the contact portion.

The semiconductor device according to an embodiment of the disclosure may further include: a third trench, formed separately from and closer to an outer side than the second trench in the peripheral region, the third trench having a width greater than a width of the first trench and smaller than a width of the second trench; third insulating film, formed on an inner surface of the third trench; and a third electrode, formed in the third trench interfaced with the third insulating film, the third electrode being electrically floating.

In the semiconductor device according to an embodiment of the disclosure, the first trench may have a first width of more than or equal to 0.17 µm and less than or equal to 0.22 µm, and the second trench may have a second width of more than or equal to 0.5 µm and less than or equal to 1.0 µm.

In the semiconductor device according to an embodiment of the disclosure, the second trench may have a depth greater than a depth of the first trench.

In the semiconductor device according to an embodiment of the disclosure, the second trench may include a plurality of trenches having different widths from one another.

In the semiconductor device according to an embodiment of the disclosure, an inner surface portion of the second trench in contact with the second thin portion may have a different surface orientation from an inner surface portion of the first trench in contact with the first thin portion.

The semiconductor device according to an embodiment of the disclosure may include a first conductivity type source region, a second conductivity type body region and a first conductivity type drift region sequentially formed from the first main surface of the semiconductor chip in a depth direction of the first trench, wherein the first electrode may include a gate electrode that forms the channel in the body region.

In the semiconductor device according to an embodiment of the disclosure, the semiconductor chip may include a silicon chip.

DETAILED DESCRIPTION OF EMBODIMENTS OF THE DISCLOSURE

Details of the embodiments of the disclosure are given with the accompanying drawings below. Moreover, in the detailed description below, constituting components in names of ordinal numerals are given; however, the ordinal numerals and the ordinal numerals of constituting components given in the claims are not necessarily consistent.

[Overall Structure of the Semiconductor Device 1]

FIG. 1 shows a schematic top view of the semiconductor device 1 according to an embodiment of the disclosure. For clarity, in FIG. 1, a package 4 is represented by an imaginary line (a dotted line), and other components are represented by solid lines.

The semiconductor device 1 includes a lead frame 2, a semiconductor component 3 and a package 4.

The lead frame 2 is formed as a metal plate in shape. The lead frame 2 is formed as a thin-wall metal plate (such as Cu) shaped as a rectangle in top view by means such as punching processing, cutting processing and bending processing. Thus, the main composition of the raw material of the lead frame 2 is Cu. Moreover, the raw material of the lead frame 2 is not limited to the example above.

The lead frame 2 may include a chip seat 21, a first lead portion 22, a second lead portion 23 and a third lead portion 24. In this embodiment, the first lead portion 22, the second lead portion 23 and the third lead portion 24 may be referred to as a source lead portion, a gate lead portion and a drain lead portion, respectively. Further, the first lead portion 22, the second lead portion 23 and the third lead portion 24 have parts exposed from the package 4 and connected to circuits outside the semiconductor device 1, and hence may also be referred to as a first terminal (source terminal), a second terminal (gate terminal) and a third terminal (drain terminal), respectively.

The chip seat 21 is shaped as a quadrilateral in top view. The quadrilateral has a pair of first sides 211A and 211B extending in the first direction X and a pair of second sides 212A and 212B extending in a direction intersecting the first direction X (an orthogonal direction in this embodiment).

The first lead portion 22, the second lead portion 23 and the third lead portion 24 are configured around the chip seat 21. In the embodiment, the first lead portion 22, the second lead portion 23 and the third lead portion 24 are configured adjacent to the first sides 211A and 211B of the chip seat 21. More specifically, the first lead portion 22 and the second lead portion 23 are configured adjacent to the first side 211A of the chip seat 21, and the third lead portion 24 is configured adjacent to the other first side 211B of the chip seat. That is, the first lead portion 22 and the second lead portion 23 are interposed by the chip seat 21 and configured on a side opposite to the third lead portion 24.

The first lead portion 22 is formed as being separate from the chip seat 21. The first lead portion 22 may include a first pad portion 221 and a first lead 222. The first pad portion 221 is substantially formed as a rectangle that is lengthwise along the first side 211A of the chip seat 21 in top view. The first lead 222 is formed as an integral with the first pad portion 221, and extends from the first pad portion 221 in a direction intersecting a lengthwise direction of the first pad portion 221. The first lead 222 is formed as being plural in quantity (three in this embodiment). The plurality of first leads 222 are arranged at intervals from one another in the common lengthwise direction of the first pad portion 221, and are connected to the common first pad portion 221.

The second lead portion 23 is formed as being separate from the chip seat 21 and the first lead portion 22. The second lead portion 23 may include a second pad portion 231 and a second lead 232. The second pad portion 231 is substantially formed as a rectangle that is lengthwise along the first side 211A of the chip seat 21 in top view. The second lead 232 is formed as an integral with the second pad portion 231, and extends from the second pad portion 231 in a direction intersecting a lengthwise direction of the second pad portion 231. The second lead 232 and the second pad portion 231 are connected one-on-one. In this embodiment, the second lead portion 23 is configured near an end portion of the first side 211A of the chip seat 21 (a corner of the chip seat 21), and the first lead portion 22 extends from the end portion along the first side 211A of the chip seat 21 to the other end portion.

The third lead portion 24, different from the first lead portion 22 and the second lead portion 23, is formed as integral with the chip seat 21. The third lead portion 24 extends from the other first side 211B of the chip seat 21 in a direction intersecting the first side 211B. The third lead 24 is formed as being plural in quantity (four in this embodiment). The plurality of third lead portions 24 are arranged at intervals from one another along the first side 211B of the chip seat 21.

The semiconductor component 3 is configured on the chip seat 21 of the lead frame 2, and is supported by the chip seat 21. The semiconductor component 3 is shaped as a quadrilateral smaller than the chip seat 21 in top view, wherein the quadrilateral has a pair of first sides 31A and 31B and a pair of second sides 32A and 32B. In this embodiment, the semiconductor component 3 is configured on the chip seat 21 in a manner of the first sides 31A and 31B being parallel to the first sides 211A and 211B of the chip seat 21 and the second sides 32A and 32B being parallel to the second sides 212A and 212B of the chip seat 21. In this embodiment, a first distance $D_1$ between the first sides 211A and 211B of the chip seat 21 and the first sides 31A and 31B of the semiconductor component 3 is smaller than a second distance $D_2$ between the second sides 212A and 212B of the chip seat 21 and the second sides 32A and 32B of the semiconductor component 3. For example, the first distance $D_1$ may be ½ of the second distance $D_2$ or less.

On one surface (an upper surface in this embodiment) of the semiconductor component 3, a conductive film 5 serving as an example of a surface electrode of the disclosure and an insulating film 6 are formed. A part of the conductive film 5 is covered by the insulating film 6. In FIG. 1, the part of the conductive film 5 covered by the insulating film 6 is represented by a shaded area, and the part exposed from the insulating film 6 is represented by an unshaded area. The conductive film 5 is a part connected by a first line 8 and a second line 10 below, and may be referred to as an electrode film or a surface electrode film.

The conductive film 5 is formed substantially in a global area of the upper surface of the semiconductor component 3. The conductive film 5 may include a first conductive film 51 serving as an example of a pad electrode portion of the disclosure, and a second conductive film 52. The first conductive film 51 and the second conductive film 52 are formed as being separated from each other.

The first conductive film 51 is formed as being plural in quantity. The plurality of first conductive films 51 are formed adjacent to one another in a direction along the second sides 32A and 32B of the semiconductor component 3, and a gap region 61 is formed between adjacent first conductive films 51. Moreover, an area around the first conductive film 51 may be referred to as a peripheral region 63. That is, when an area where the first conductive film 51 is formed (an area covered by the first conductive film 51) is referred to as an active region 64, the peripheral region 63 may also be the peripheral region 63 surrounding the active region 64. Moreover, in this embodiment, the peripheral region 63 is a loop formed along the perimeter of the semiconductor component 3, and may also be referred to as a perimeter region.

In this embodiment, each first conductive film 51 is formed as a rectangle in shape that is lengthwise along the first sides 31A and 31B of the semiconductor component 3 in top view. The first conductive film 51 has a part thereof serving as a first pad 7 exposed from the insulating film 6.

The first line 8 is connected to the first pad 7. In this embodiment, the first line 8 includes a Cu line having Cu as the main component. Examples of lines having Cu as the main component may be: lines having Cu as one single component (e.g., containing Cu in a purity of 99.99% or more), Cu alloy lines made of Cu alloyed with other alloy components, and lines formed by Cu as one single component or Cu alloy lines clad by a conductive layer. Examples of alloy components in the Cu alloy line may be Ag, Au, Al, Ni, Be, Fe, Ti, Pd, Zn and Sn. Examples of the conductive layer cladding the Cu line may be Pd. Moreover, the first line 8 may also be implemented by an Au line or Al line as a varied embodiment. When an Au line is used as a bonding line, costs may be unstable as a result of high costs and fluctuating prices of Au, and line stripping can be easily caused by compound growth between Au and Al in a high-temperature environment. Moreover, when an Al line is used as a bonding line, Al has a relatively low melting point, and is prone to re-recrystallization in a high-temperature environment. Thus, by using a Cu line as the first line 8, a semiconductor device having higher reliability can be provided compared to a situation where an Au line or an Al line is used. The first line 8 may have a diameter of more than or equal to 18 μm and less than or equal to 50 μm, when it is, for example, a Cu line.

The first line 8 can connect the first pad 7 to the first pad portion 221 of the first lead portion 22. The first line 8 may include a long line 81, and a short line 82 shorter than the long line 81. The long line 81 may be connected to, between a pair of adjacent first pad 7, the first pad 7 away from the side of the first lead portion 22. On the other hand, the short line 82 may be connected to, between the pair of adjacent first pad 7, the first pad 7 close to the side of the first lead portion 22.

The long line 81 and the short line 82 each are provided as being plural in quantity, and may be alternately arranged in the lengthwise direction of the first pad portion 221. Moreover, a bonding portion 811 of the long wire 81 on the side of the first pad portion 221 and a bonding portion 821 of the short wire 82 on the side of the first pad portion 221 are arranged as being shifted toward one side and other side relative to the lengthwise direction of the first pad portion 221, respectively. Accordingly, the bonding portion 811 of the long line 81 and the bonding portion 821 of the short line 82 are in a staggered arrangement to prevent mutual contact. As a result, space saving of the first lead portion 22 can be achieved.

The second conductive film 52 may integrally include a pad electrode portion 521 and a finger electrode portion 522. The pad electrode portion 521 is formed in the peripheral region 63, and is arranged on one corner of the semiconductor component 3 in this embodiment. The finger electrode portion 522 is formed in the peripheral region 63 from the pad electrode portion 521 along the peripheral portion of the semiconductor component 3. In this embodiment, the finger electrode portion 522 is formed as surrounding the first conductive film 51 along the first sides 31A and 31B and the second sides 32A and 32B of the semiconductor component 3. Moreover, the finger electrode portion 522 may also be formed in the gap region 61 between adjacent first conductive films 51. Accordingly, each first conductive film 51 is surrounded by the finger electrode portion 522.

The finger electrode portion 522 is covered by the insulating film 6, and on the other hand, the pad electrode portion 521 has a part thereof serving as a second pad 9 exposed from the insulating film 6.

The second line 10 is connected to the second pad 9. The second line 10 may be formed of the same material as the first line 8. That is, in this embodiment, the second line 10 may include a Cu line having Cu as the main component, or may be implemented by an Au line or Al line as a varied embodiment. Moreover, the second line 10 may have the same diameter as the first line 8. That is, the second line 10 may have a diameter of more than or equal to 18 μm and less than or equal to 50 μm, when it is, for example, a Cu line.

The second line 10 can connect the second pad 9 to the second pad portion 231 of the second lead portion 23. The second line 10 may have a length shorter than that of the short line 82 of the first line 8.

The package 4 covers the semiconductor component 3, the first line 8, the second line 10 and a part of the lead frame 2, and may also be referred to as sealing resin. The package 4 includes an insulative raw material. In this embodiment, the package 4 is, for example, black epoxy resin.

[Structure of the Active Region 64]

Figure 2:
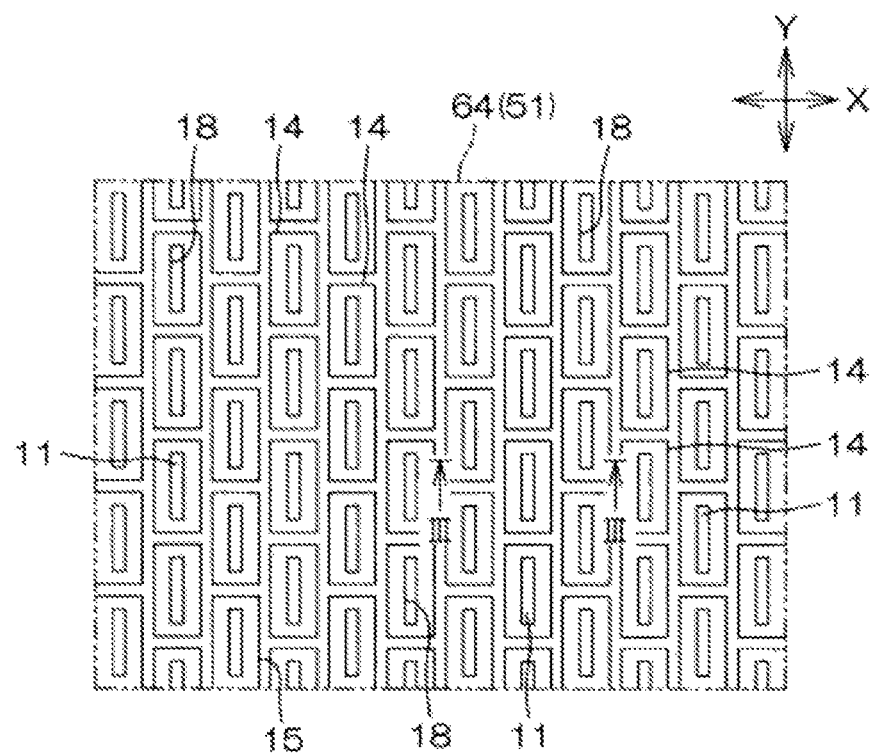
FIG. 2 is a diagram of a planar structure of an active region in FIG. 1.
Figure 3:
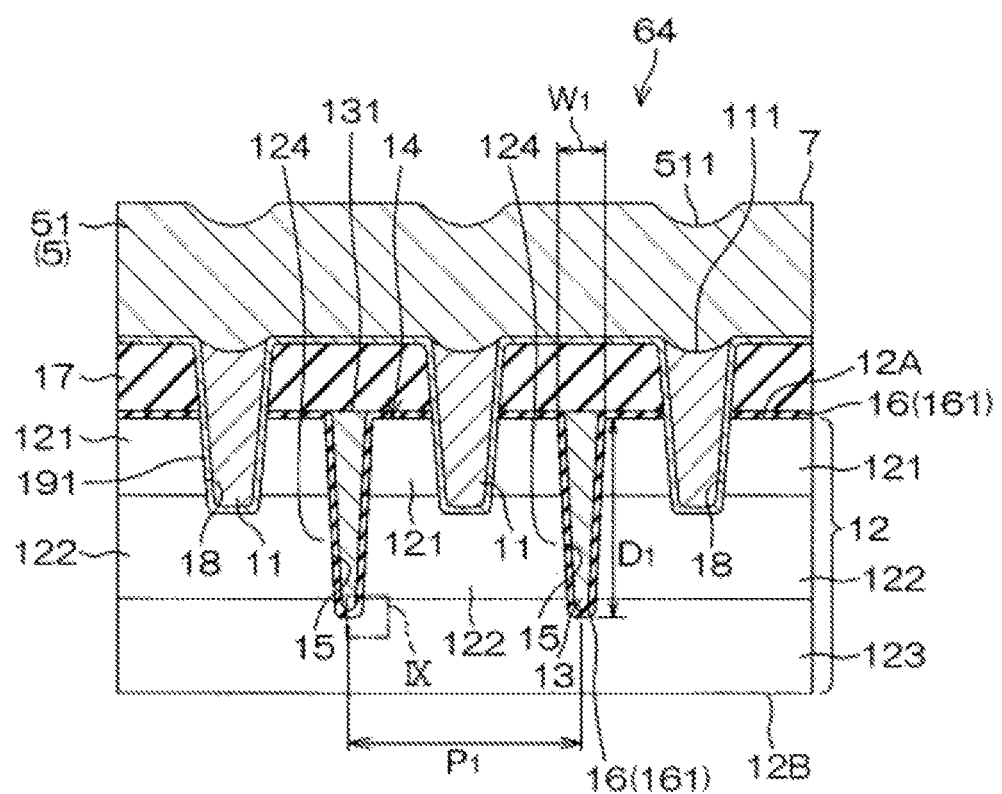
FIG. 3 is a section diagram of FIG. 2 along III-III.

FIG. 2 shows a partial enlarged diagram of a planar structure of the active region 64 in FIG. 1. FIG. 3 shows a diagram of FIG. 2 along III-III.

The semiconductor device 1 includes a semiconductor chip 12, a first impurity region 121 (source), a second impurity region 122 (body), a third impurity region 123 (drain), a gate trench 15 (first trench), a gate insulating film 16 (first insulating film), a gate electrode 13 (first electrode), an interlayer insulating film 17, a source trench 18, and a first contact plug 11.

The semiconductor chip 12 forms the shape of the semiconductor component 3, for example, a structural body formed of a monocrystalline semiconductor material in a small plate (cuboid). The semiconductor chip 12 is formed of a semiconductor material such as Si and SiC. The semiconductor chip 12 has a first main surface 12A, and a second main surface 12B on a side opposite to the first main surface 12A. The first main surface 12A is a mounting surface on which functional devices are formed. The second main surface 12B is a non-mounting surface on which no functional device is formed. In this embodiment, the semiconductor chip 12 may include at least one of a semiconductor substrate and an epitaxial layer.

As shown in FIG. 3, the first impurity region 121 is a p-type impurity region selectively formed in a surface layer portion of the first main surface 12A of the semiconductor chip 12 below the first conductive film 51. The p-type impurity concentration of the first impurity region 121 may be more than or equal to $1\times10^{18}$ cm$^{-3}$ and less than or equal to $1 \times 10^{20}$ cm$^{-3}$. Moreover, in this embodiment, the first impurity region 121 may also be referred to as a p-type source region.

The second impurity region 122 is an n-type impurity region formed in the surface layer portion of the first main surface 12A of the semiconductor chip 12. The second impurity region 122 is spaced from the first main surface 12A toward the side of the second main surface 12B, and is formed in a manner of adjoining the first impurity region 121. That is, the second impurity region 122 is interfaced with the first impurity region 121 and faces the first main surface 12A. The n-type impurity concentration of the second impurity region 122 may be more than or equal to $1 \times 10^{15}$ cm$^{-3}$ and less than or equal to $\times 10^{19}$ cm$^{-3}$. Moreover, in this embodiment, the second impurity region 122 may also be referred to as an n-type body region.

The third impurity region 123 is a p-type impurity region formed in the surface layer portion of the second main surface 12B of the semiconductor chip 12. The third impurity region 123 is formed globally in the surface layer portion of the second main surface 12B in a manner of adjoining the second impurity region 122, and is exposed from the second main surface 12B. The p-type impurity concentration of the third impurity region 123 may be lower than the p-type impurity concentration of the first impurity region 121, and is, for example, more than or equal to $1 \times 10^{18}$ cm$^{-3}$ and less than or equal to $1 \times 10^{21}$ cm$^{-3}$.

The thickness of the third impurity region 123 is, for example, more than or equal to 1 µm and less than or equal to 500 µm. Moreover, in this embodiment, the third impurity region 123 may also be referred to as a p-type drift region or a p-type drain region.

The gate trench 15 is a concave portion penetrating the first impurity region 121 and the second impurity region 122 and reaches the third impurity region 123. As shown in FIG. 2, the gate trench 15 divides the transistor unit 14 including the first impurity region 121, the second impurity region 122 and the third impurity region 123 by surrounding these regions 121, 122 and 123. In this embodiment, as shown in FIG. 2, the transistor unit 14 is selectively formed in a region below the first conductive film 51. That is, the transistor unit 14 is covered by the first conductive film 51 but not covered by the second conductive film 52.

In FIG. 2, the transistor units 14 are arranged in a staggered pattern. The arrangement pattern of the transistor units 14 may be rectangular or strip-like (not shown). Each transistor unit 14 is formed as a quadrilateral in shape in top view in FIG. 2, and is formed as a rectangle in shape in this embodiment.

The gate trench 15 is formed between the plurality of transistors 14 in the arrangement above. The gate trench 15 is gradually tapered from an opening width $W_1$ toward the depth direction of the gate trench 15. The width $W_1$ of the gate trench 15 is, for example, more than or equal to 0.17 µm and less than or equal to 0.22 µm at an opening end of the gate trench 15. Moreover, as shown in FIG. 3, a gap $P_1$ between adjacent gate trenches 15 may be, for example, 1 µm or less. As shown in FIG. 2, when the gate trenches 15 are connected by respectively surrounding the plurality of transistor units 14, the gap $P_1$ between the gate trenches 15 may be, for example, a distance from the facing gate trench 15 interfaced with one transistor unit 14. In addition, a depth $D_1$ of the gate trench 15 is, for example, more than or equal to 0.8 µm and less than or equal to 1.2 µm.

As shown in FIG. 3, the gate insulating film 16 covers the inner surface of the gate trench 15. Moreover, the gate insulating film 16 covers the first main surface 12A of the semiconductor chip 12. The gate insulating film 16 is formed of, for example, an insulative material containing SiO$_2$ or SiN. The part of the overall gate insulating film 16 formed in the active region 64 or the part formed on the inner surface of the gate trench 15 may also be referred to as a first insulating film 161 of the gate insulating film 16, so as to be easily distinguished from a second insulating film 162 and a third insulating film 163 in the description below.

The gate electrode 13 is accommodated (embedded) in the gate trench 15. With the structure above, miniaturization and low conduction resistance can be achieved compared to a planar structure. Moreover, the gate electrode 13 is insulated from the semiconductor chip 12 by the gate insulating film 16 to prevent the occurrence of leakage current. The gate electrode 13 is a conductive material including such as polycrystalline silicon. Polycrystalline silicon and monocrystalline silicon have substantially the same melting point. Thus, by using polycrystalline silicon as the gate electrode 13, manufacturing process limitations imposed by temperature on the manufacturing process after forming the gate electrode 13 are eliminated.

The gate electrode 13 faces the second impurity region 122 interfaced with the gate insulating film 16.

In the second impurity region 122, a side surface portion of the gate trench 115 facing the gate electrode 13 is a channel region 124. By applying a voltage to the gate electrode 13, carriers (electrons in this embodiment) can be sensed in the channel region 124, so that conduction is achieved between the first impurity region 121 and the third impurity region 123. That is, in the semiconductor device 1, the transistor unit 14 and the gate electrode 13 form the component structure.

As shown in FIG. 3, the gate electrode 13 may have an upper surface 131 that is on the same leveled surface with the first main surface 12A of the semiconductor chip 12 or recessed toward the side of the second main surface 12B. On the first main surface 12A of the semiconductor chip 12, the interlayer insulating film 17 is formed in a manner of covering the gate insulating film 16 and the gate electrode 13. The interlayer insulating film 17 insulates the gate electrode 13 from the first conductive film 51. Thus, the gate electrode 13 becomes a structure that is covered by the gate insulating film 16 and the interlayer insulating film 17. The gate insulating film 17 is formed of an insulative material containing SiO$_2$ or SiN.

Referring to FIG. 2 and FIG. 3, the source trench 18 is formed in each transistor unit 14. In this embodiment, one source trench 18 is formed in each transistor unit 14; however, a plurality of source trenches 18 may also be formed in each transistor unit 14. The source trench 18 is formed as a rectangle in shape that is lengthwise in the lengthwise direction of the rectangular transistor unit 14 in top view.

Referring to FIG. 3, the source trench 18 is a concave portion penetrating the interlayer insulating film 17, the gate insulating film 16 and the first impurity region 121, and reaches the second impurity region 122. The source trench 18 is gradually tapered from an opening width toward the depth direction of the source trench 18. Moreover, a gap between adjacent source trenches 18 is the same as the gap $P_1$ between the source trenches 15, and may be, for example, 1 µm or less.

The first contact plug 11 is interfaced with the first barrier film 191 and is embedded in the source trench 18. With the structure above, the semiconductor device 1 achieving an alleviated concentrated electric field at the bottom of the gate trench 15 and enhanced reliability can be provided.

The first barrier film 191 suppresses diffusion of the material forming the first contact plug 11 to the interlayer insulating film 17. In this embodiment, the first contact plug 11 may include tungsten (W), and the first barrier film 19 may include a Ti-containing material (for example, a single-layer structure of Ti, or a layered structure of Ti and TiN). The thickness of the first barrier layer 191 is, for example, more than or equal to 500 Å and less than or equal to 700 Å.

One and the other surface of the first barrier film 191 are formed along the inner surface of the source trench 18 and the upper surface of the interlayer insulating film 17, and are in direct communication with the first impurity region 121 and the second impurity region 122. Moreover, the first barrier layer 191 horizontally passes through the boundary of adjacent transistor units 14, that is, a region above the gate trench 15, and is continuous.

The first contact plug 11 is in communication with the first impurity region 121 and the second impurity region 122 through the first barrier film 191. The first contact plug 11 has an upper surface 111 recessed toward the side of the first main surface 12A of the semiconductor chip 12 relative to the upper surface of the interlayer insulating film 17.

The first conductive film 51 is formed on the interlayer insulating film 17. The first conductive film 51 may also be referred to as a source electrode film on the basis of an electrical connection target. The first conductive film 51 is in communication with the first impurity region 121 and the second impurity region 122 through the first contact plug 11 and the first barrier film 191. The first conductive film 51 includes, for example, a material containing Al, and includes AlCu in this embodiment.

As described above, the upper surface 111 of the first contact plug 11 is recessed relative to the upper surface of the interlayer insulating film 17. Thus, on the upper surface of the first conductive film 51, a concave portion 511 may be formed on a position facing the upper surface 111 in a layering direction of the first conductive film 51.

Moreover, a drain electrode layer connected to the third impurity region 123 is formed on the second main surface 12B of the semiconductor chip 12, but is omitted from drawing.

[Structure of the Peripheral Region 63]

Figure 4:
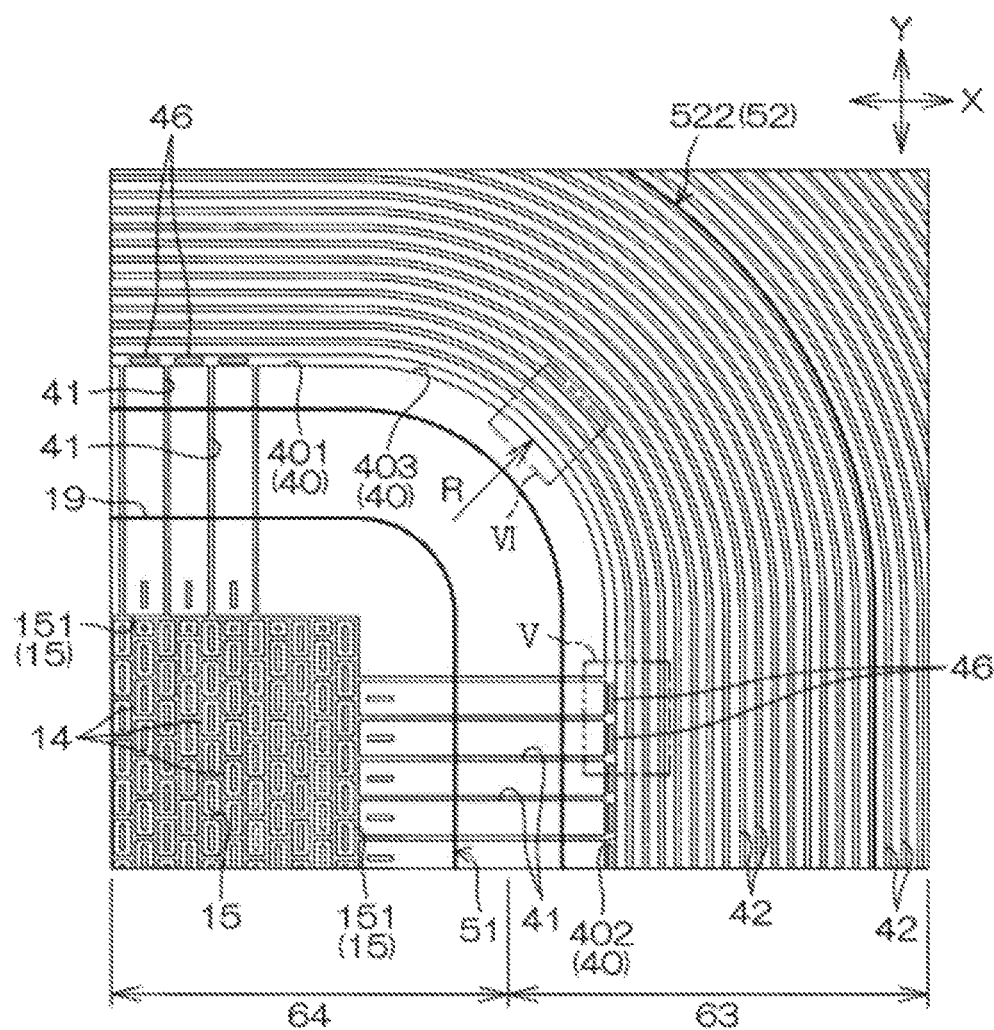
FIG. 4 is a diagram of a planar structure of a peripheral region in FIG. 1.
Figure 5:
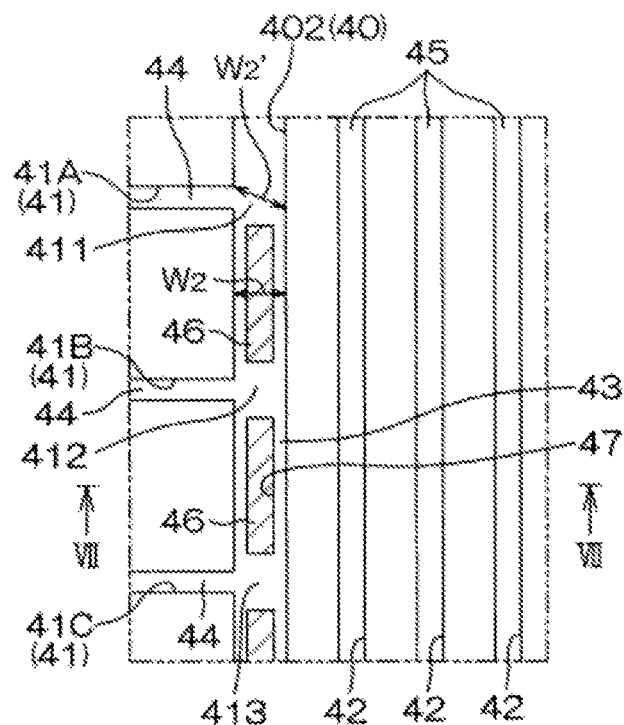
FIG. 5 is an enlarged view of a part surrounded by the double-dotted line V in FIG. 4.
Figure 6:
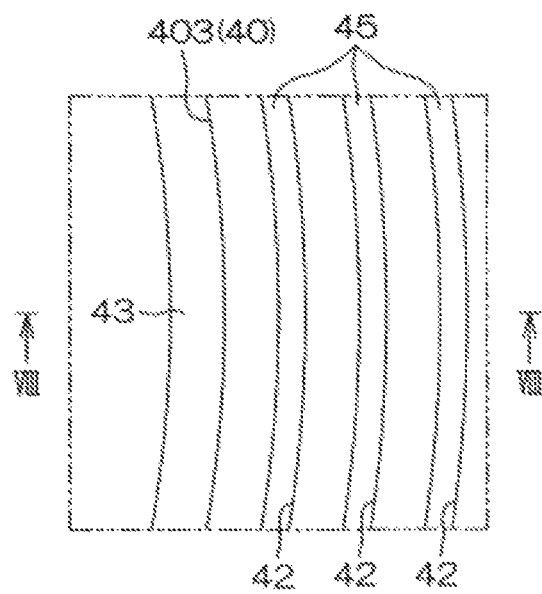
FIG. 6 is an enlarged view of a part surrounded by the double-dotted line VI in FIG. 4.
Figure 7:
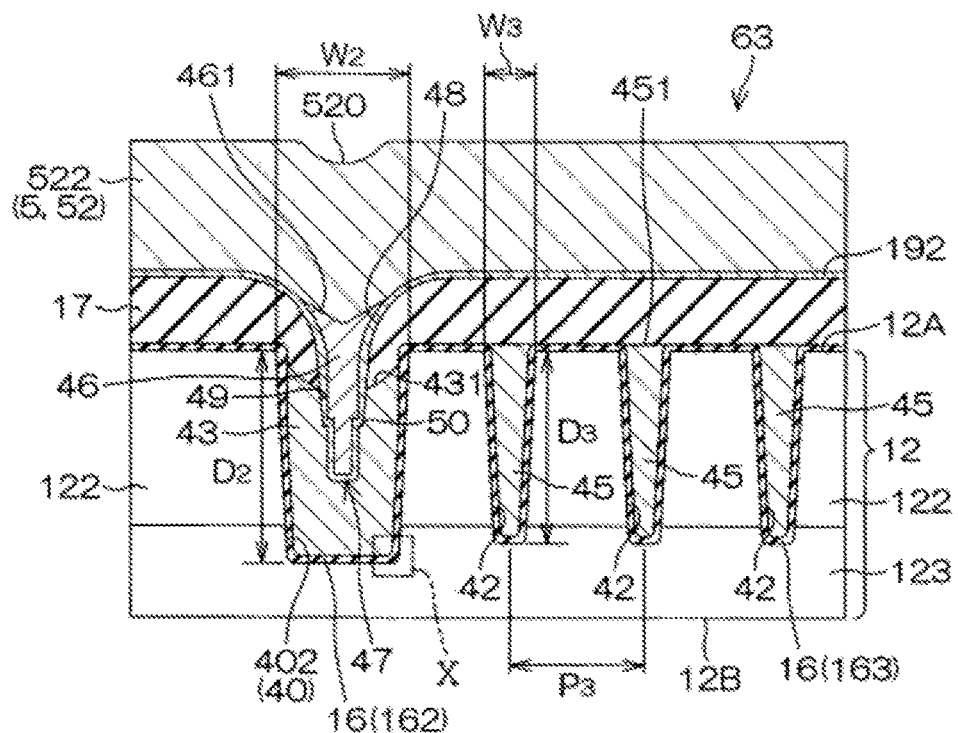
FIG. 7 is a section diagram of FIG. 5 along VII-VII.
Figure 8:
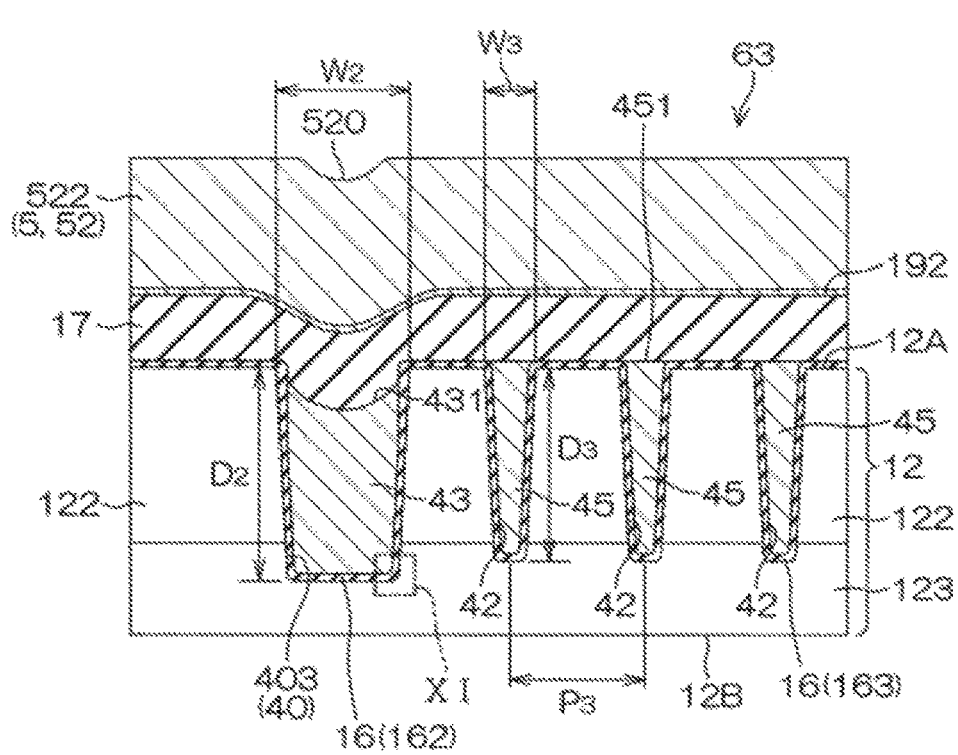
FIG. 8 is a section diagram of FIG. 6 along VIII-VIII.

FIG. 4 shows a diagram of a planar structure of the peripheral region 63 in FIG. 1, and is an enlarged diagram of a corner of the semiconductor component 3 in FIG. 1. FIG. 5 shows an enlarged view of a part surrounded by the double-dotted line V in FIG. 4. FIG. 6 shows an enlarged view of a part surrounded by the double-dotted line VI in FIG. 4. FIG. 7 shows a section diagram of FIG. 5 along VII-VII. FIG. 8 shows a section diagram of FIG. 6 along VIII-VIII.

Referring to FIG. 7 and FIG. 8, the semiconductor device 1 has the second impurity region 122 and the third impurity region 123 as the impurity region in the peripheral region 63. The second impurity region 122 is exposed from the first main surface 12A of the semiconductor chip 12.

In the peripheral region 63, the semiconductor device 1 includes a first peripheral trench 40 (second trench), a connection trench 41, a second peripheral trench 42 (third trench), a gate insulating film 16, a first peripheral electrode 43 (second electrode), a connection electrode 44, a second peripheral electrode 45 (third electrode), and a second contact plug 46 (contact portion).

The first peripheral trench 40 is a concave portion penetrating the second impurity region 122 and reaches the third impurity region 123. The first peripheral trench 40 is formed as a loop surrounding the aggregate of the transistor units 14 formed in the active region 64. The first peripheral trench 40 is covered by the second conductive film 52 (finger electrode portion 522).

Referring to FIG. 7 and FIG. 8, the first peripheral trench 40 is gradually tapered from an opening width $W_2$ toward the depth direction of the first peripheral trench 40. The width $W_2$ of the first peripheral trench 40 is greater than the width $W_1$ of the gate trench 15, for example, more than or equal to 0.5 µm and less than or equal to 1.0 µm at an opening end of the first peripheral trench 40. In addition, a depth $D_2$ of the first peripheral trench 40 is greater than the depth $D_1$ of the gate trench 15, for example, more than or equal to 1.0 µm and less than or equal to 1.4 µm.

Referring to FIG. 4, the first peripheral trench 40 includes a first linear portion 401 extending in the first direction X, a second linear portion 402 extending in the second direction Y, and a corner portion 403 connecting the first linear portion 401 and the second linear portion 402. The corner portion 403 may also be an intersecting portion of the first linear portion 401 and the second linear portion 402. The corner portion 403 may be a curved shape protruding to an outer side of the peripheral region 63. For example, the corner portion 403 may curve in a manner of having a specified curvature radius R (for example, more than or equal to 15 µm and less than or equal to 50 µm).

The connection trench 41 is a concave portion connecting the gate trench 15 and the first peripheral trench 40. The connection trench 41 is formed as straddling between the active region 64 and the peripheral region 63. In other words, the connection trench 41 horizontally passes through the boundary between the active region 64 and the peripheral region 63 (for example, as shown in FIG. 4, the gap region 19 between the first conductive film 51 and the second conductive film 52). In this embodiment, as shown in FIG. 4, the connection trench 41 extends in the first direction X and the second direction Y from the loop-like outer gate trench 151 formed around the aggregate of the transistor units 14, and is connected to the first linear portion 401 and the second linear portion 402 of the first peripheral trench 40.

The connection trench 41 includes a plurality of parallel strip-like connection trenches 41, and the connection trench 41 may be individually connected to different positions of the first peripheral trench 40. For example, referring to FIG. 5, the connection trench 41 may include: a first connection trench 41A connected to the first peripheral trench 40 at a first connection point 411, a second connection trench 41B connected to the first peripheral trench 40 at a second connection point 412, and a third connection trench 41C connected to the first peripheral trench 40 at a third connection point 413. The first to third connection points 411 to 413 may be intersections formed by T-intersections of the first to third connection trenches 14A to 14C and the first peripheral trench 40, respectively.

The second peripheral trench 42 is a concave portion penetrating the second impurity region 122 and reaching the third impurity region 123. The second peripheral trench 42 is formed closer to the outer side than the first peripheral trench 40 and independent from the first peripheral trench 40, and is formed as a loop surrounding the aggregate of the transistor units 14 formed in the active region 64. Referring to FIG. 4, the second peripheral trench 42 is formed as being plural in quantity (for example, 10 or more). Some of the second peripheral trenches 42 may be covered by the second conductive film 52 (the finger electrode portion 522), and the rest are formed closer to the outer side than the second conductive film 52 and surrounding the second conductive film 52.

Referring to FIG. 7 and FIG. 8, the second peripheral trench 42 is gradually tapered from an opening width $W_3$ toward the depth direction of the second peripheral trench 42. The width $W_3$ of the second peripheral trench 42 is greater than the width $W_1$ of the gate trench 15, and smaller than the width $W_2$ of the first peripheral trench 41, for example, more than or equal to 0.23 μm and less than or equal to 0.28 μm at an opening end of the second peripheral trench 42. Moreover, a gap $P_3$ between adjacent second peripheral trenches 42 may be, for example, 1 μm or less. In addition, a depth $D_3$ of the second peripheral trench 42 is smaller than the depth $D_2$ of the first peripheral trench 40, for example, more than or equal to 0.8 μm and less than or equal to 1.2 μm.

Referring to FIG. 7 and FIG. 8, in the peripheral region 63, the gate insulating film 16 covers an inner surface of the first peripheral trench 40 and an inner surface of the second peripheral trench 42, and covers the first main surface 12A of the semiconductor chip 12. The part of the overall gate insulating film 16 formed on the inner surface of the first peripheral trench 40 and the inner surface of the second peripheral trench 42 may also be referred to as a second insulating film 162 and a third insulating film 163, respectively. That is, in this embodiment, the first insulating film 161 formed in the active region 64 and the second insulating film 162 and the third insulating film 163 formed in the peripheral region 63 are interfaced with the gate insulating film 16 on the first main surface 12A and are formed integrally. Moreover, an inner surface of the connection trench 41 is also covered by the gate insulating film 16, but is omitted from the drawing.

The first peripheral electrode 43 is accommodated (embedded) in the first peripheral trench 40. The first peripheral electrode 43 may be made of the same material as the gate electrode 13. That is, the first peripheral electrode 43 is a conductive material including such as polycrystalline silicon. Polycrystalline silicon and monocrystalline silicon have substantially the same melting point. Thus, by using polycrystalline silicon as the first peripheral electrode 43, manufacturing process limitations imposed by temperature on the manufacturing process after forming the first peripheral electrode 43 are eliminated. The first peripheral electrode 43 faces the second impurity region 122 interfaced with the second insulating film 162. As shown in FIG. 7 and FIG. 8, the first peripheral electrode 43 may have an upper surface 431 that is recessed toward the side of the second main surface 12B relative to the first main surface 12A of the semiconductor chip 12.

Referring to FIG. 5, the connection electrode 44 is accommodated (embedded) in the connection trench 41. The connection trench 44 may be made of the same material as the gate electrode 13. That is, the connection electrode 44 is a conductive material including such as polycrystalline silicon. Polycrystalline silicon and monocrystalline silicon have substantially the same melting point. Thus, by using polycrystalline silicon as the connection electrode 44, manufacturing process limitations imposed by temperature on the manufacturing process after forming the connection electrode 44 are eliminated. Similar to the first peripheral electrode 43, the connection electrode 44 faces the second impurity region 122 interfaced with the gate insulating film 16 formed on the inner surface of the connection trench 41, but is omitted from the drawing. The connection electrode 44 is formed integrally with the gate electrode 13 and the first peripheral electrode 43, and thus electrically connects the gate electrode 13 and the first peripheral electrode 43.

The second peripheral electrode 45 is accommodated (embedded) in the second peripheral trench 42. The second peripheral electrode 45 may be made of the same material as the gate electrode 13. That is, the second peripheral electrode 45 is a conductive material including such as polycrystalline silicon. Polycrystalline silicon and monocrystalline silicon have substantially the same melting point. Thus, by using polycrystalline silicon as the second peripheral electrode 45, manufacturing process limitations imposed by temperature on the manufacturing process after forming the second peripheral electrode 45 are eliminated. The second peripheral electrode 45 faces the second impurity region 122 interfaced with the third insulating film 163. The second peripheral electrode 45 is electrically separated from the gate electrode 13 and the first peripheral electrode 43, and is an electrically floating electrode in this embodiment. As shown in FIG. 7 and FIG. 8, the second peripheral electrode 45 may have an upper surface 451 that is on the same leveled surface with the first main surface 12A of the semiconductor chip 12 or recessed toward the side of the second main surface 12B.

The interlayer insulating film 17 is formed in a manner of covering the gate insulating film 16, the first peripheral electrode 43, the connection electrode 44 and the second peripheral electrode 45. The interlayer insulating film 17 insulates the first peripheral electrode 43, the connection electrode 44 and the second peripheral electrode 45 from the second conductive film 52.

A contact hole 47 is formed at the interlayer insulating film 17. The contact hole 47 reaches an intermediate portion of the first peripheral portion 43 in a depth direction of the first peripheral trench 40. Thus, the side surface of the contact hole 47 may include: a first side surface 48 (upper side surface) as an insulating region formed by the interlayer insulating film 17, and a second side surface 49 (lower side surface) as a conductive region formed by the first peripheral electrode 43. Moreover, on the second side surface 49 of the contact hole 47, a step difference 50 may be formed by narrowing in steps the width of the contact hole 47 in the first peripheral electrode 43.

The contact hole 47 is formed at the first linear portion 401 and the second linear portion 402 of the first peripheral trench 40. Further, referring to FIG. 5, the structure of the contact hole 47 formed at the second linear portion 402 is described below; however, the description below also applies to the first linear portion 401.

The contact hole 47 is formed on a position in the second linear portion 402 avoided from the connection point (the first to third connection points 411 to 413 in FIG. 5) of the connection trench 41. More specifically, the contact hole 47 is formed on a part of the first peripheral trench 40 between the adjacent connecting parts 411 to 413. At the first to third connection points 411 to 413, the side surface of the first peripheral trench 40 is replaced by the connection trench 40, and thus a part having a width $W_2'$ greater than the width $W_2$ of the first peripheral trench 40 is generated. The embeddedness of an embedded electrode (e.g., polycrystalline silicon) gets lower as the width of a trench increases, and there is a possibility of a cavity-like defect called a cavity after embedding. For example, in the example in FIG. 5, defects may occur at the first peripheral electrode 43 near centers of the first to third connection points 411 to 413. Thus, as the contact hole 47 is formed in a manner of avoiding from the first to third connection points 411 to 413, a second contact plug 46 may be well connected to the first peripheral electrode 43.

The second contact plug 46 is interfaced with the second barrier film 192 and is embedded in the contact hole 47. The second barrier film 192 suppresses diffusion of the material forming the second contact plug 46 to the interlayer insulating film 17. In this embodiment, the second contact plug 46 may include tungsten (W), and the second barrier film 192 may include a Ti-containing material (for example, a single-layer structure of Ti, or a layered structure of Ti and TiN). The thickness of the second barrier film 192 is, for example, more than or equal to 500 Å and less than or equal to 700 Å.

One surface and the other surface of the second barrier film 192 are formed along an inner surface of the contact hole 47 and the upper surface of the interlayer insulating film 17, and are in direct communication with the first peripheral electrode 43. The second contact plug 46 is in communication with the first peripheral electrode 43 via the second barrier film 192. The second contact plug 46 has an upper surface 461 recessed toward the side of the first main surface 12A of the semiconductor chip 12 relative to the upper surface of the interlayer insulating film 17.

The second conductive film 52 is formed on the interlayer insulating film 17. The second conductive film 52 may also be referred to as a gate electrode film on the basis of an electrical connection target. The second conductive film 52 is in communication with the gate electrode 13 through the second contact plug 46, the second barrier film 192, the first peripheral electrode 43 and the connection electrode 44. The second conductive film 52 includes, for example, a material containing Al, and includes AlCu in this embodiment.

As described above, the upper surface 461 of the second contact plug 46 is recessed relative to the upper surface of the interlayer insulating film 17. Thus, on the upper surface of the second conductive film 52, a concave portion 520 may be formed on a position facing the upper surface 461 in the layering direction of the second conductive film 52.

[Comparison of Thicknesses of the First Insulating Film 161 and the Second Insulating Film 162]

Figure 9:
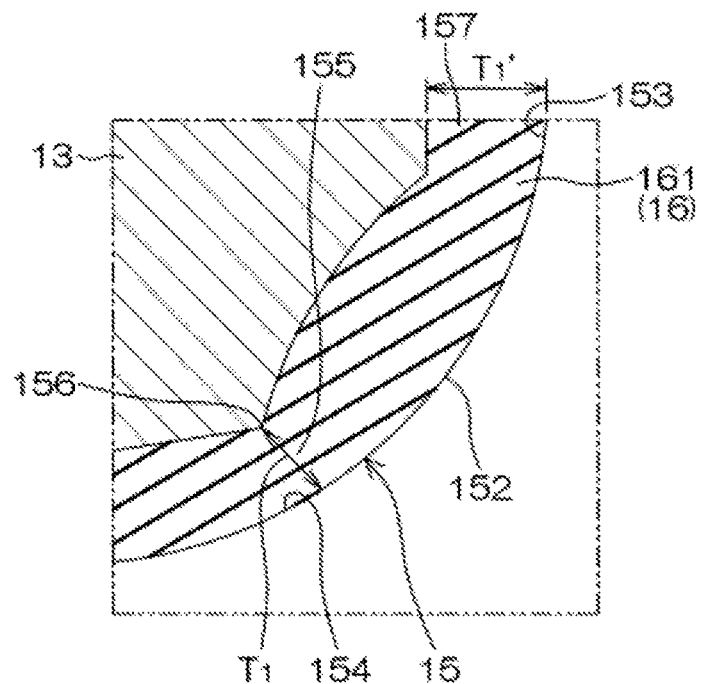
FIG. 9 is an enlarged view of a part surrounded by the double-dotted line IX in FIG. 3.
Figure 10:
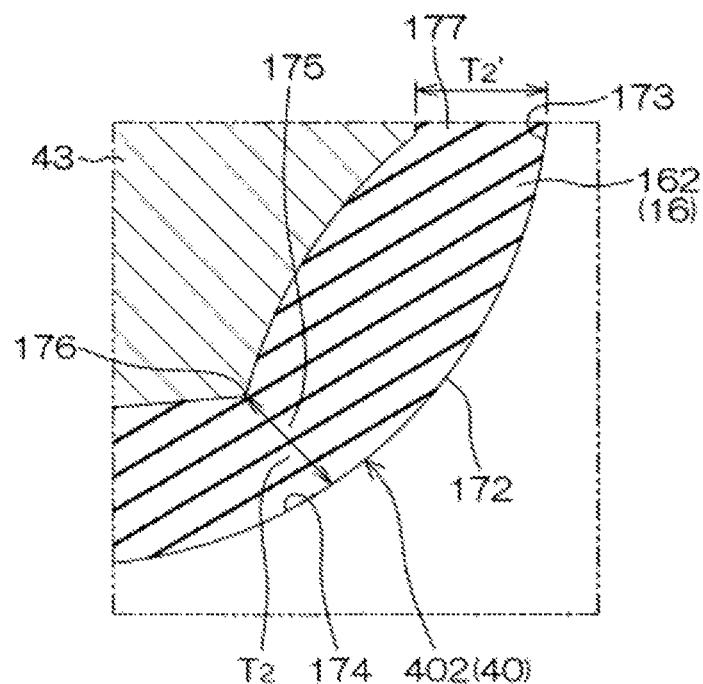
FIG. 10 is an enlarged view of a part surrounded by the double-dotted line X in FIG. 7.
Figure 11:
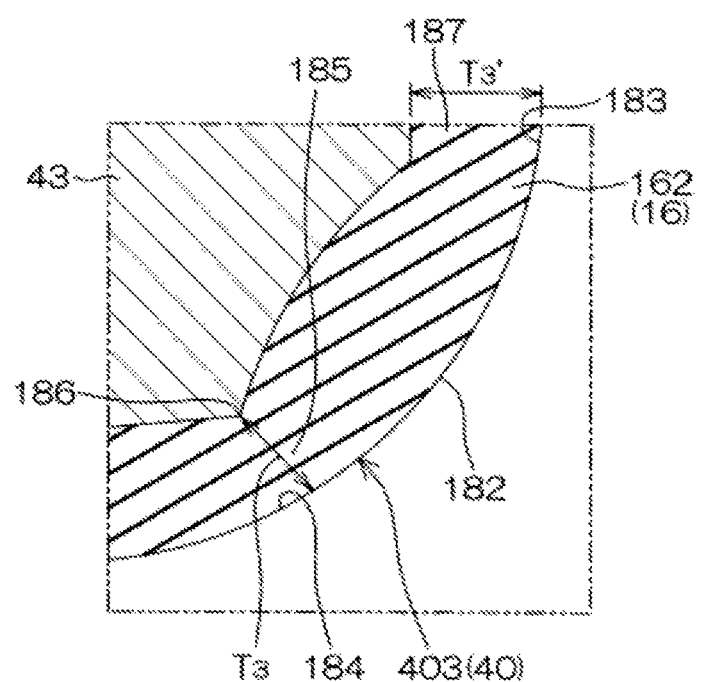
FIG. 11 is an enlarged view of a part surrounded by the double-dotted line XI in FIG. 8.

FIG. 9 shows an enlarged view of a part surrounded by the double-dotted line IX in FIG. 3. FIG. 10 shows an enlarged view of a part surrounded by the double-dotted line X in FIG. 7. FIG. 11 shows an enlarged view of a part surrounded by the double-dotted line XI in FIG. 8. Referring to FIG. 10, the structure of the second linear portion 402 between the first linear portion 401 and the second linear portion 402 of the first peripheral trench 40 is adopted; however, the structure of the first linear portion 401 is the same as the structure of the second linear portion 402.

Next, referring to FIG. 9 to FIG. 11, comparison of the thicknesses of the first insulating film 161 and the second insulating film 162 is described below.

Referring to FIG. 9, the gate trench 15 has a bottom portion 152. The bottom portion 152 may be, for example, the part closer to the lower side than the part of the side surface 153 of the gate trench 15 that changes in the depth direction of the gate trench 15. In this embodiment, the side surface 153 starts to curve from a specified position in the depth direction of the gate trench 15, and the part closer to the lower side than the curve starting part is referred to the bottom portion 152. Thus, the bottom portion 152 may have a curved surface 154 expanding toward an outer side of the gate trench 15.

Moreover, at the bottom portion 152 of the gate trench 15, the first insulating film 161 has a first thin portion 155 selectively thinner than other part of the first insulating film 161. In this embodiment, the first insulating film 161 has a first thin concave portion 156. The first thin concave portion 156 is selectively recessed at the bottom portion 152 of the gate trench 15 in a direction approaching the inner surface (the curved surface 154 in this embodiment) of the gate trench 15. The first thin portion 155 may be a part sandwiched between the first thin concave portion 156 and the inner surface (the curved surface 154) of the gate trench 15. On the other hand, other parts of the first insulating film 161 may be, for example, a part 157 on the side surface 153 of the gate trench 15.

The thickness $T_1$ of the first thin portion 155 may be, for example, more than or equal to 340 Å and less than or equal to 450 Å. On the other hand, the thickness $T_1'$ of the part 157 of the first insulating film 161 may be, for example, more than or equal to 450 Å and less than or equal to 600 Å.

Referring to FIG. 10, the second linear portion 402 of the first peripheral trench 40 has a bottom portion 172. The bottom portion 172 may be, for example, the part closer to the lower side than the part of the side surface 173 of the second linear portion 402 of the first peripheral trench 40 that changes in the depth direction of the second linear portion 402 of the first peripheral trench 40. In this embodiment, the side surface 173 starts to curve from a specified position in the depth direction of the second linear portion 402 of the first peripheral trench 40, and the part closer to the lower side than the curve starting part may be referred to the bottom portion 172. Thus, the bottom portion 172 may have a curved surface 174 expanding toward an outer side of the second linear portion 402 of the first peripheral trench 40.

Moreover, at the bottom portion 172 of the second linear portion 402 of the first peripheral trench 40, the second insulating film 162 has a second thin portion 175 selectively thinner than other parts of the second insulating film 162. In this embodiment, the second insulating film 162 has a second thin concave portion 176. The second thin concave portion 176 is selectively recessed at the bottom portion 172 of the second linear portion 402 of the first peripheral trench 40 in a direction approaching the inner surface (the curved surface 174 in this embodiment) of the second linear portion 402 of the first peripheral trench 40. The second thin portion 175 may be a part sandwiched between the second thin concave portion 176 and the inner surface (the curved surface 174) of the second linear portion 402 of the first peripheral trench 40. On the other hand, other parts of the second insulating film 162 may be, for example, a part 177 on the side surface 173 of the second linear portion 402 of the first peripheral trench 40.

The thickness $T_2$ of the second thin portion 175 is greater than the thickness $T_1$ of the first thin portion 155, and may be, for example, more than or equal to 420 Å and less than or equal to 550 Å. On the other hand, the thickness $T_2'$ of the part 177 of the second insulating film 162 may be, for example, more than or equal to 450 Å and less than or equal to 600 Å.

Referring to FIG. 11, the corner portion 403 of the first peripheral trench 40 has a bottom portion 182. The bottom portion 182 may be, for example, the part closer to the lower side than the part of the side surface 183 of the corner portion 403 of the first peripheral trench 40 that changes in the depth direction of the corner portion 403 of the first peripheral trench 40. In this embodiment, the side surface 183 starts to curve from a specified position in the depth direction of the corner portion 403 of the first peripheral trench 40, and the part closer to the lower side than the curve starting part may be referred to the bottom portion 182.

Thus, the bottom portion 182 may have a curved surface 184 expanding toward an outer side of the corner portion 403 of the first peripheral trench 40.

Moreover, at the bottom portion 182 of the corner portion 403 of the first peripheral trench 40, the second insulating film 162 has a third thin portion 185 selectively thinner than other parts of the second insulating film 162. In this embodiment, the second insulating film 162 has a third thin concave portion 186. The third thin concave portion 186 is selectively recessed at the bottom portion 182 of the corner portion 403 of the first peripheral trench 40 in a direction approaching the inner surface (the curved surface 184 in this embodiment) of the corner portion 403 of the first peripheral trench 40. The third thin portion 185 may be a part sandwiched between the third thin concave portion 186 and the inner surface (the curved surface 184) of the corner portion 403 of the first peripheral trench 40. On the other hand, other parts of the second insulating film 162 may be, for example, a part 187 on the side surface 183 of the corner portion 403 of the first peripheral trench 40.

The thickness $T_3$ of the third thin portion 185 greater than the thickness $T_1$ of the first thin portion 155 and smaller than the thickness $T_2$ of the second thin portion 175, and may be, for example, more than or equal to 350 Å and less than or equal to 500 Å. On the other hand, the thickness $T_3{}'$ of the part 187 of the second insulating film 162 may be, for example, more than or equal to 450 Å and less than or equal to 600 Å.

[Manufacturing Method of the Semiconductor Component 3]

FIG. 12A to FIG. 20A, FIG. 12B to FIG. 20B, and FIG. 12C to FIG. 20C are diagrams of some manufacturing steps of the semiconductor component 3 according to the orders of the steps. FIG. 21A to FIG. 21C are diagrams of related steps for forming first to third thin portions 155, 175 and 185. FIG. 12A to FIG. 20A are vertical section diagrams of parts corresponding to FIG. 3. FIG. 12B to FIG. 20B are vertical section diagrams of parts corresponding to FIG. 7. FIG. 12C to FIG. 20C are vertical section diagrams of parts corresponding to FIG. 8. Moreover, in FIG. 12A to FIG. 20A, FIG. 12B to FIG. 20B and FIG. 12C to FIG. 20C, only reference symbols of components shown in FIG. 3, FIG. 7 and FIG. 8 needed by the manufacturing steps of the semiconductor component 3 are indicated, and the other reference symbols are omitted.

Figure 12A:
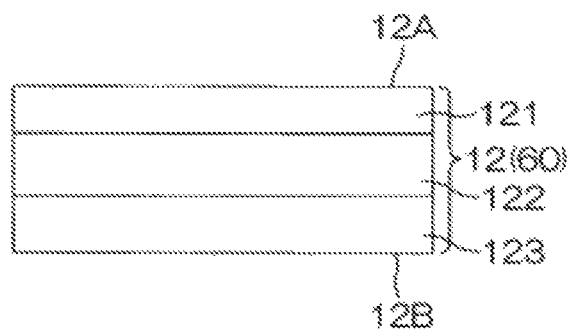
FIG. 12A to FIG. 12C are diagrams of a part of manufacturing steps of the semiconductor device in FIG. 1.
Figure 12B:
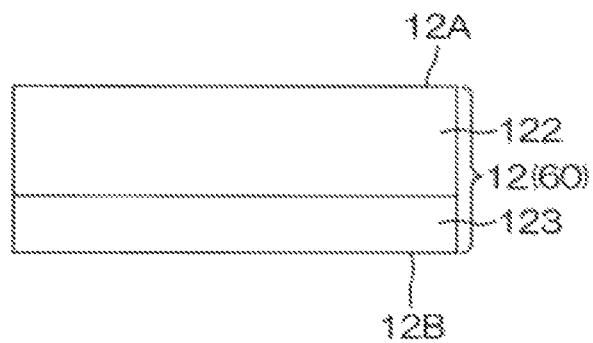
Figure 12C:
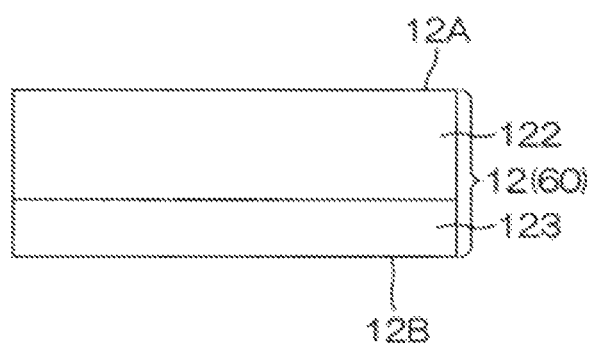

Referring to FIG. 12A to FIG. 12C, to manufacture the semiconductor device 1, a semiconductor wafer (not shown) is first prepared. A p-type epitaxial layer 60 is then formed on the semiconductor wafer. A first main surface of the epitaxial layer and a second man surface on the opposite side may correspond to the first main surface 12A and the second main surface 12B, respectively. Next, a p-type impurity and an n-type impurity are selectively injected to the surface layer portion of the first main surface 12A of the epitaxial layer 60, respectively, to form the p-type first impurity region 121 and the n-type second impurity region 122. Moreover, the p-type third impurity region 123 is formed in the remaining region of the epitaxial layer 60. Accordingly, the semiconductor chip 12 including the epitaxial layer 60 is formed.

Figure 13A:
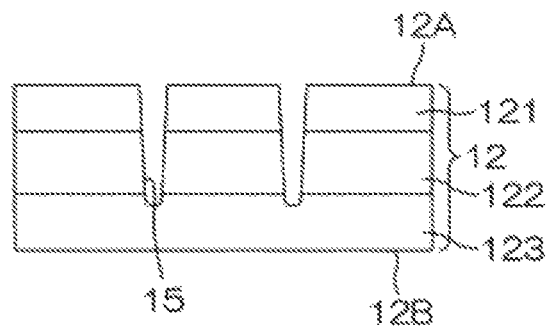
FIG. 13A to FIG. 13C are diagrams of following steps of FIG. 12A to 12C, respectively.
Figure 13B:
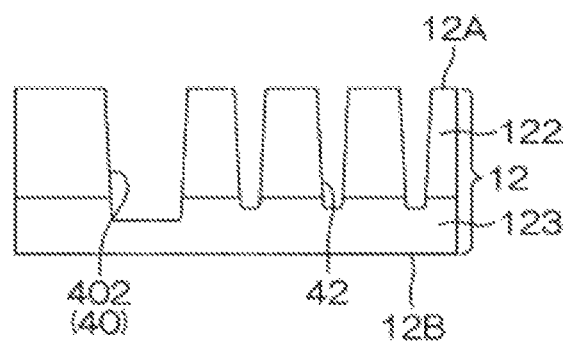
Figure 13C:
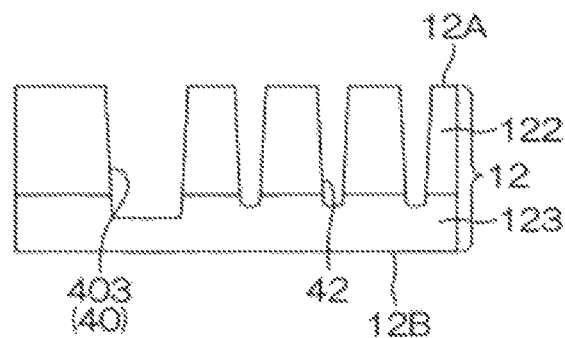

Next, referring to FIG. 13A to FIG. 13C, the gate trench 15, the first peripheral trench 40, the connection trench 41 (not shown) and the second peripheral trench 42 are formed. For example, a photoresist (not shown) is formed on the first main surface 12A of the semiconductor chip 12, and etching is performed using the photoresist, so as to selectively form the gate trench 15, the first peripheral trench 40, the connection trench 41 (not shown) and the second peripheral trench 42.

Figure 14A:
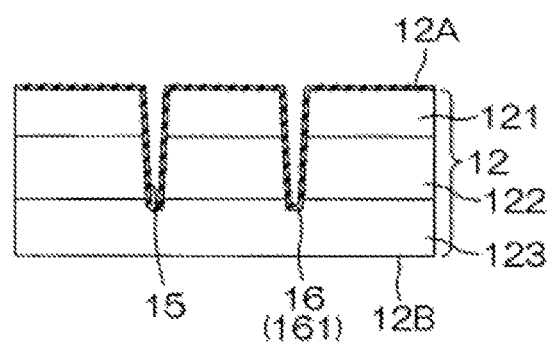
FIG. 14A to FIG. 14C are diagrams of following steps of FIG. 13A to 13C, respectively.
Figure 14B:
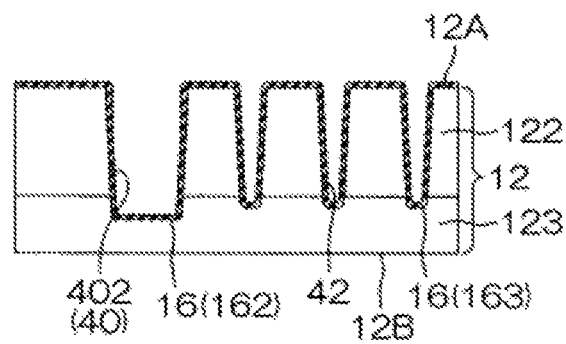
Figure 14C:
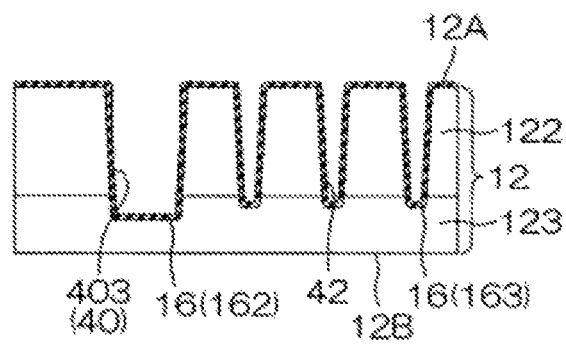

Next, referring to FIG. 14A to FIG. 14C, by a heat treatment such as thermal oxidation, the first main surface 12A of the semiconductor chip 12, the inner surface of the gate trench 15, the inner surface of the first peripheral trench 40, the inner surface (not shown) of the connection trench 41 and the inner surface of the second peripheral trench 42 are oxidized. Accordingly, the gate insulating film 16 is formed on the first main surface 12A, the inner surface of the gate trench 15, the inner surface of the first peripheral trench 40, the inner surface (not shown) of the connection trench 41 and the inner surface of the second peripheral trench 42.

Moreover, referring to FIG. 21A to FIG. 21C, the thermal oxidation on the gate insulating film 16 is described in detail below.

First of all, referring to FIG. 21A, at the bottom portion 152 of the gate trench 15, an oxidation film grows in two directions of the part facing above and the part facing the side of the curved surface 154, so that an extrusion force (arrow A) acts toward the outer side (in a direction of the inner surface of the gate trench 15) at the connection point of the film growing in the two direction. Thus, the first thin concave portion 156 is selectively formed on the first insulating film 161, and the first thin portion 155 is formed on the position of the first thin concave portion 156. According to a similar principle, at the second linear portion 402 and the corner portion 403 of the first peripheral trench 40, the second thin portion 175 and the third thin portion 185 are also formed under the action of the arrows B and C.

A difference between the thickness $T_2$ of the second thin portion 175 and the thickness $T_3$ of the third thin portion 185 generated in the same first peripheral trench 40 is due to the different surface orientations of the curved surface 174 of the second linear portion 402 and the curved surface 184 of the corner portion 403. That is, the curved portion 174 where the relatively thicker second thin portion 175 is formed has a surface orientation yielding a faster oxidation film growth speed than the curved surface 184. The reason for the above is that, the curved surface 184 is formed at the corner portion 403 that curves relative to the first linear portion 401 and the second linear portion 402 respectively extending in the first direction X and the second direction Y.

Similarly, the curved surface 184 also has a surface orientation different from the surface orientation of the curved surface 154 of the gate trench 15. Accordingly, on top of the difference in the oxidation film growth speed generated due to the difference between the width $W_1$ of the gate trench 15 and the width $W_2$ of the first peripheral trench 40, on the curve surface 184, the third thin portion 185 thicker than the first thin portion 155 is formed also because of the difference in the surface orientation from the curve surface 154.

Moreover, in this embodiment, the width $W_2$ of the first peripheral trench 40 is greater than the width $W_1$ of the gate trench 15. Thus, when the same step is used to form the first insulating film 161 and the second insulating film 162 of the gate insulating film 16, the material gas for forming the gate insulating film 16 is allowed to better spread throughout the inside closer to the first peripheral trench 40 than the gate trench 15. Accordingly, the second insulating film 162 can be formed at a film forming speed (second film forming speed) faster than a film forming speed (first film forming speed) of the first insulating film 161 with respect to the inner surface of the gate trench 15. As a result, the thickness $T_2$ of the second thin portion 175 and the thickness $T_3$ of the third thin portion 185 can be greater than the thickness $T_1$ of the first thin portion 155.

Figure 15A:
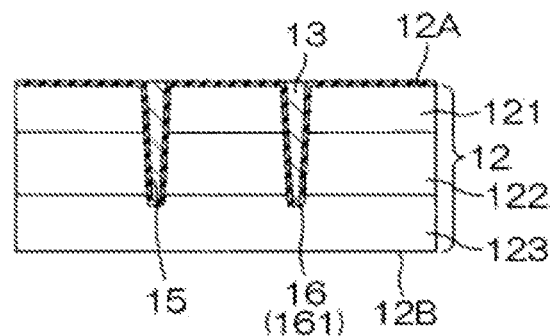
FIG. 15A to FIG. 15C are diagrams of following steps of FIG. 14A to 14C, respectively.
Figure 15B:
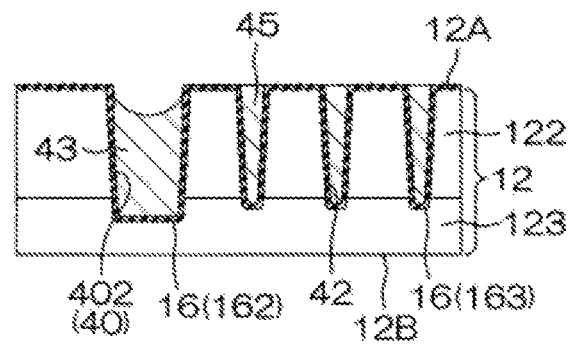
Figure 15C:
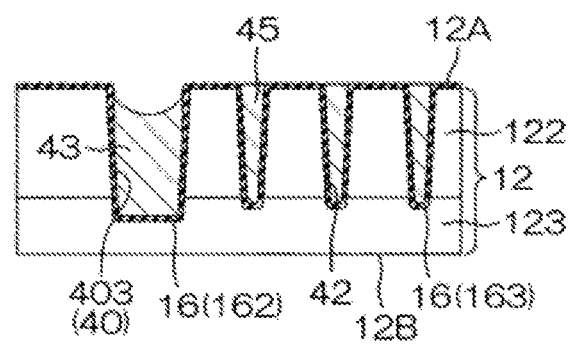

Next, referring to FIG. 15A to FIG. 15C, the gate electrode 13, the first peripheral electrode 43, the connection electrode 44 (not shown) and the second peripheral electrode 45 are formed. For example, chemical vapor deposition (CVD) is used to form a polycrystalline silicon film on the gate insulating film 16. Unwanted parts of the polycrystalline silicon film are then removed by such as etching, so as to form the gate electrode 13, the first peripheral electrode 43, the connection electrode 44 (not shown) and the second peripheral electrode 45.

Figure 16A:
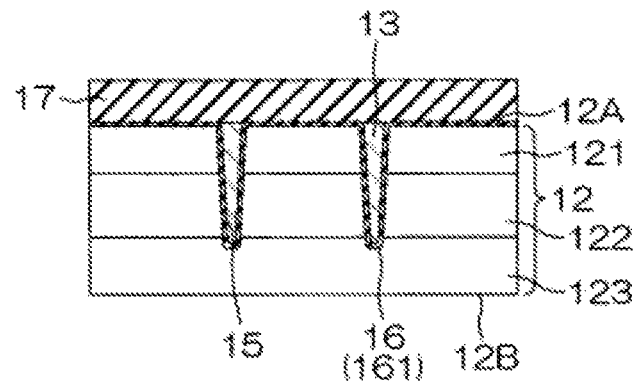
FIG. 16A to FIG. 16C are diagrams of following steps of FIG. 15A to 15C, respectively.
Figure 16B:
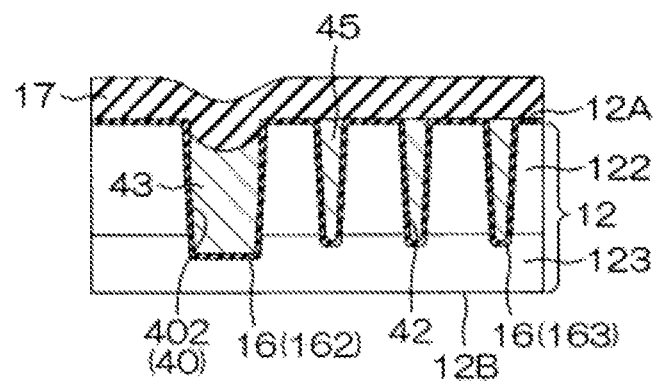
Figure 16C:
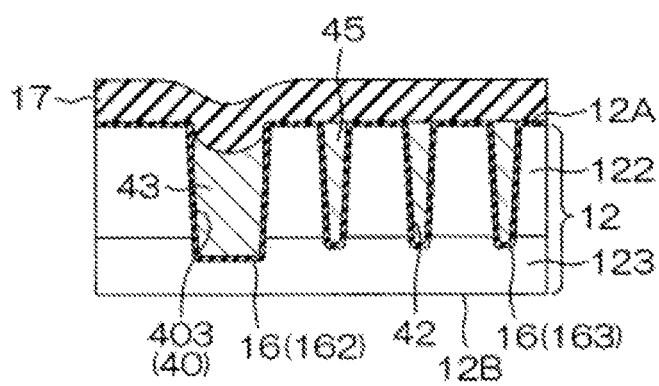

Next, referring to FIG. 16A to FIG. 16C, by CVD, for example, the interlayer insulating film 17 is formed in a manner of covering gate insulating film 16, the gate electrode 13, the first peripheral electrode 43, the connection electrode 44 (not shown) and the second peripheral electrode 45 on the first main surface 12A.

Figure 17A:
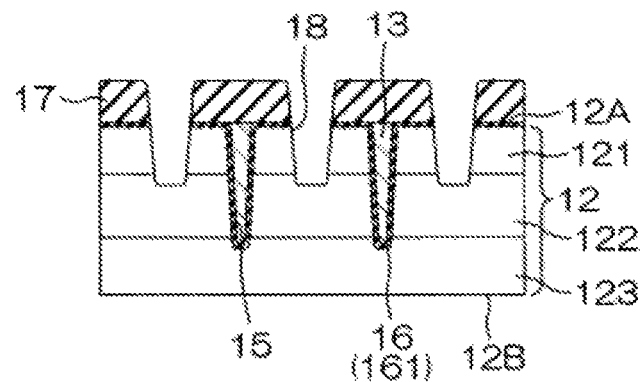
FIG. 17A to FIG. 17C are diagrams of following steps of FIG. 16A to 16C, respectively.
Figure 17B:
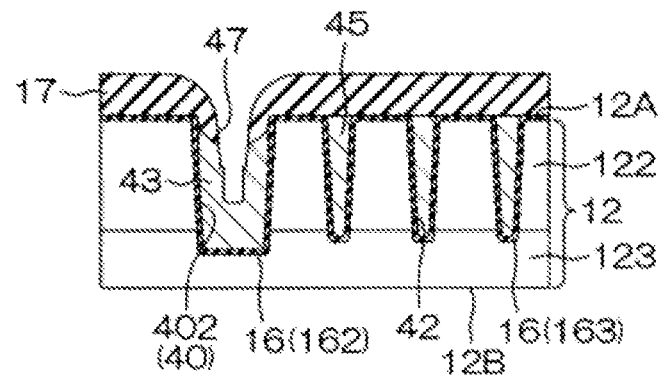
Figure 17C:
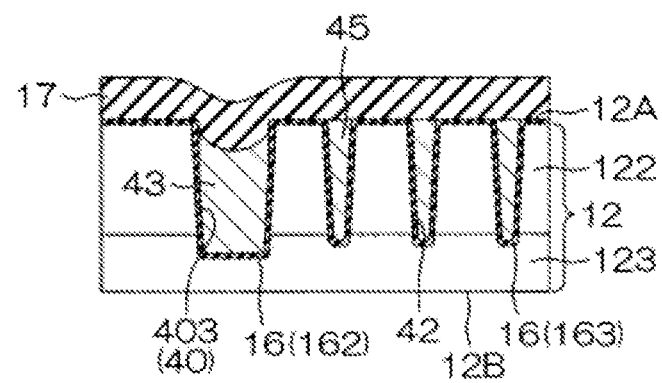

Next, referring to FIG. 17A to 17C, the interlayer insulating film 17, the gate insulating film 16, the first impurity region 121, the second impurity region 122 and the first peripheral electrode 43 are partially etched to form the source trench 18 and the contact hole 47.

Figure 18A:
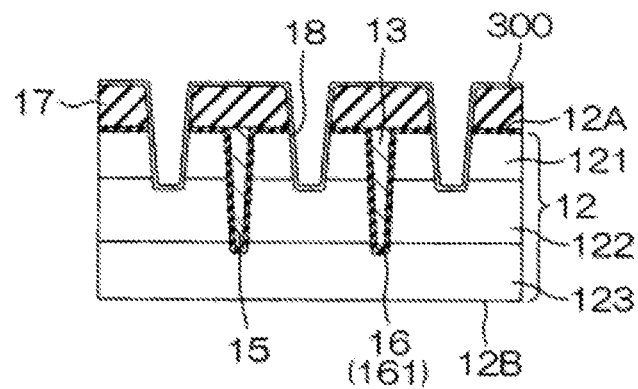
FIG. 18A to FIG. 18C are diagrams of following steps of FIG. 17A to 17C, respectively.
Figure 18B:
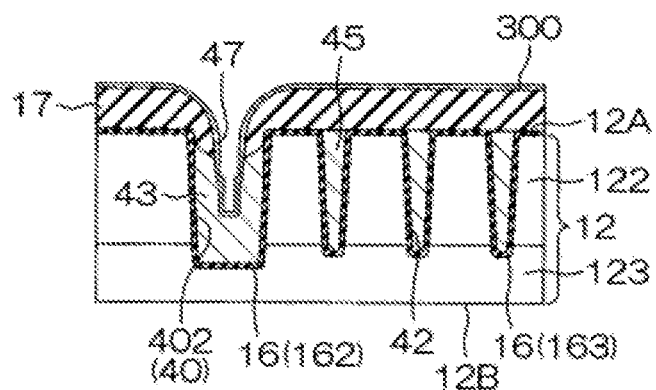
Figure 18C:
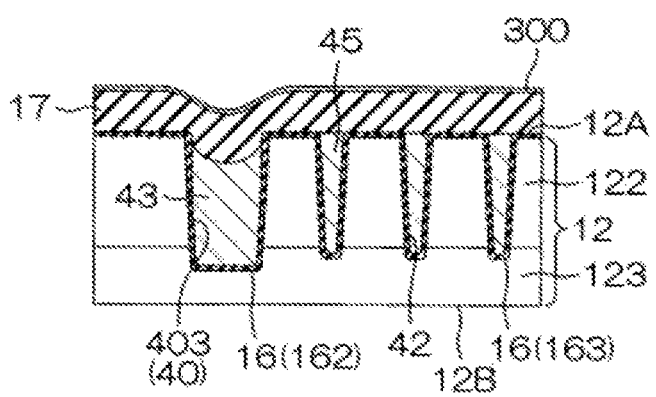

Next, referring to FIG. 18A to 18C, a barrier material film 300 is formed. For example, an electrode material is deposited by such as sputtering to accordingly form the barrier material film 300. The barrier material film 300 includes, for example, a Ti-containing material. To serve as the barrier material film 300, a Ti film may be first be formed by sputtering, and a TiN film is formed on the Ti film by sputtering, accordingly manufacturing a layered structure of the Ti film and the TiN film. The barrier material film 300 is formed continuously in an adjoining manner among the inner surface of the source trench 18, the inner surface of the contact hole 47 and the upper surface of the interlayer insulating film 17.

Figure 19A:
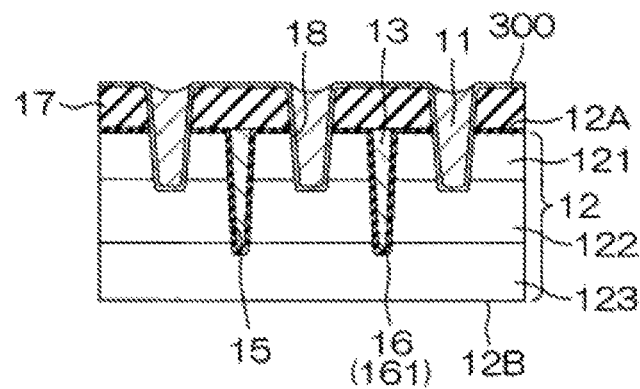
FIG. 19A to FIG. 19C are diagrams of following steps of FIG. 18A to 18C, respectively.
Figure 19B:
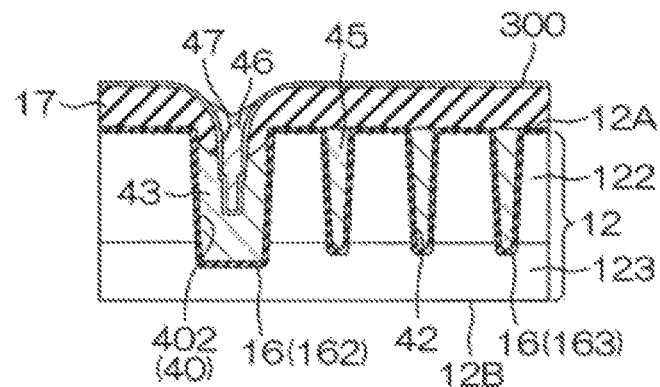
Figure 19C:
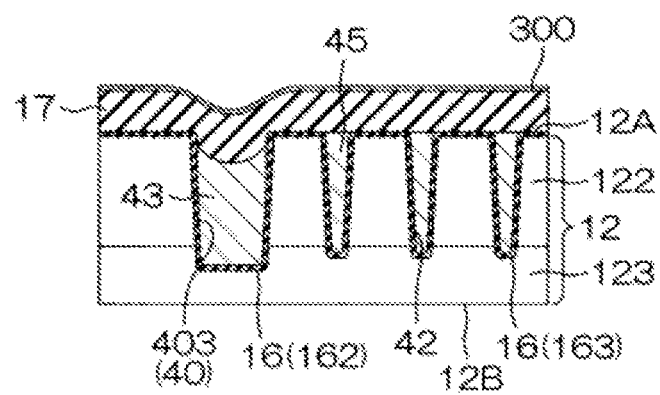

Next, referring to FIG. 19A to FIG. 19C, the first contact plug 11 is formed in the source trench 18, and the second contact plug 46 is formed in the contact hole 47. For example, an electrode material is deposited on the barrier material film 300 by such as CVD. Then, unwanted parts of the electrode material are removed by etching, and the electrode material remaining in the source trench 18 then forms the first contact plug 11, and the electrode material left in the contact hole 47 forms the second contact plug 46. The first contact plug 11 and the second contact plug 46 include, for example, a W-containing material.

Figure 20A:
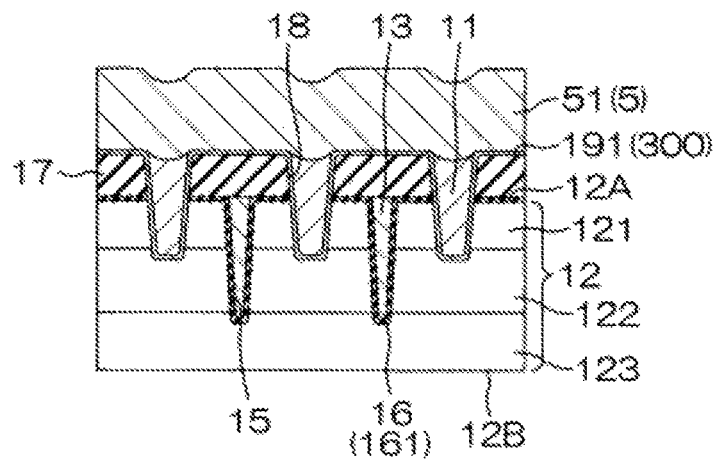
FIG. 20A to FIG. 20C are diagrams of following steps of FIG. 19A to 19C, respectively.
Figure 20B:
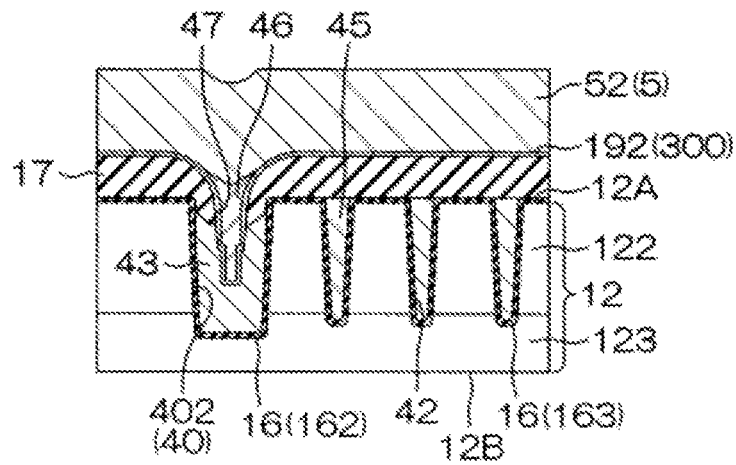
Figure 20C:
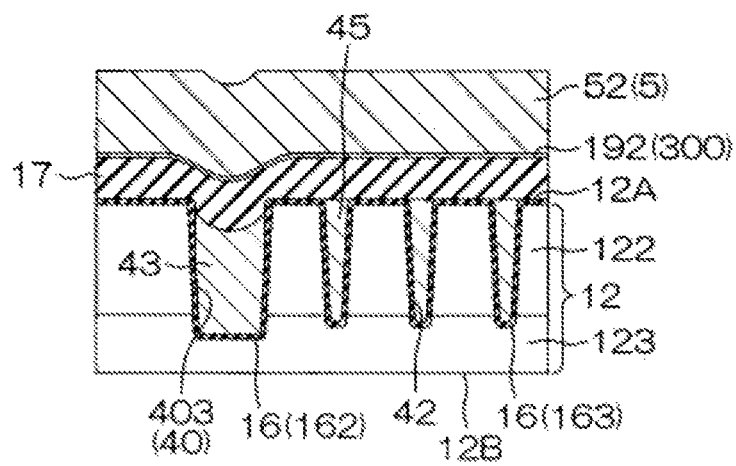

Next, referring to FIG. 20A to 20C, a conductive material film 301 is formed. For example, an electrode material is deposited on the barrier material film 300 by such as sputtering to accordingly form the conductive material film 301. The conductive material film 301 may include, for example, AlCu. Next, the conductive material film 301 and the barrier material film 300 are selectively etched to divide these films 300 and 301 into a plurality of regions. Accordingly, the first conductive film 51 and the second conductive film 52 of the conductive film 5 are formed. Moreover, the first barrier film 191 and the second barrier film 192 are formed. Then, an insulating material is deposited in a manner of covering the conductive film 5, and the insulating material is selectively etched to accordingly form the insulating film 6 (not shown).

Next, after forming the drain electrode layer (not shown) on a back surface of the semiconductor wafer by evaporation, sputtering and coating, a plurality of semiconductor components 3 are cut from the semiconductor wafer. The semiconductor component 3 is manufactured by the steps including the processes above.

According to the embodiment above, the width $W_2$ of the first peripheral trench 40 is greater than the width $W_1$ of the gate trench 15. Thus, when the same step is used to form the first insulating film 161 and the second insulating film 162 of the gate insulating film 16 (referring to FIG. 14A to FIG. 14C), the material gas for forming the gate insulating film 16 is allowed to better spread throughout the inside closer to the first peripheral trench 40 than the gate trench 15. Accordingly, the second insulating film 162 can be formed at a film forming speed (second film forming speed) faster than a film forming speed (first film forming speed) of the first insulating film 161 with respect to the inner surface of the gate trench 15.

As a result, for example, in the stage in which the film thickness of the first insulating film 161 (for example, the film thickness of the part facing the channel region 124) reaches a predetermined designed thickness based on target conduction characteristics by supplying the material gas, the third thin portion 185 of the second insulating film 162 can be formed as being relatively thicker. For example, the third thin portion 185 of the second insulating film 162 can be formed as being relatively thicker than the first thin portion 155 of the first insulating film 161 as a result.

Accordingly, in the corner portion 403 of the first peripheral trench 40 where the electric field is likely to be gathered in the semiconductor chip 12, the resistance against insulation damage of the second insulating film 162 (the third thin portion 185) can be enhanced. On the other hand, by forming the first insulating film 161 at a film forming speed slower than that of the second insulating film 162 instead of forming the first insulating film 161 and the second insulating film 162 to both be thicker, the film thickness of the first insulating film 161 is kept at the designed film thickness. As a result, the increase in the conduction resistance of components caused by thickening of the third thin portion 185 can be prevented. That is, according to the semiconductor device 1, any degraded conduction characteristics of components can be reduced and at the same time the reliability against insulation damage can be enhanced.

Figure 22:
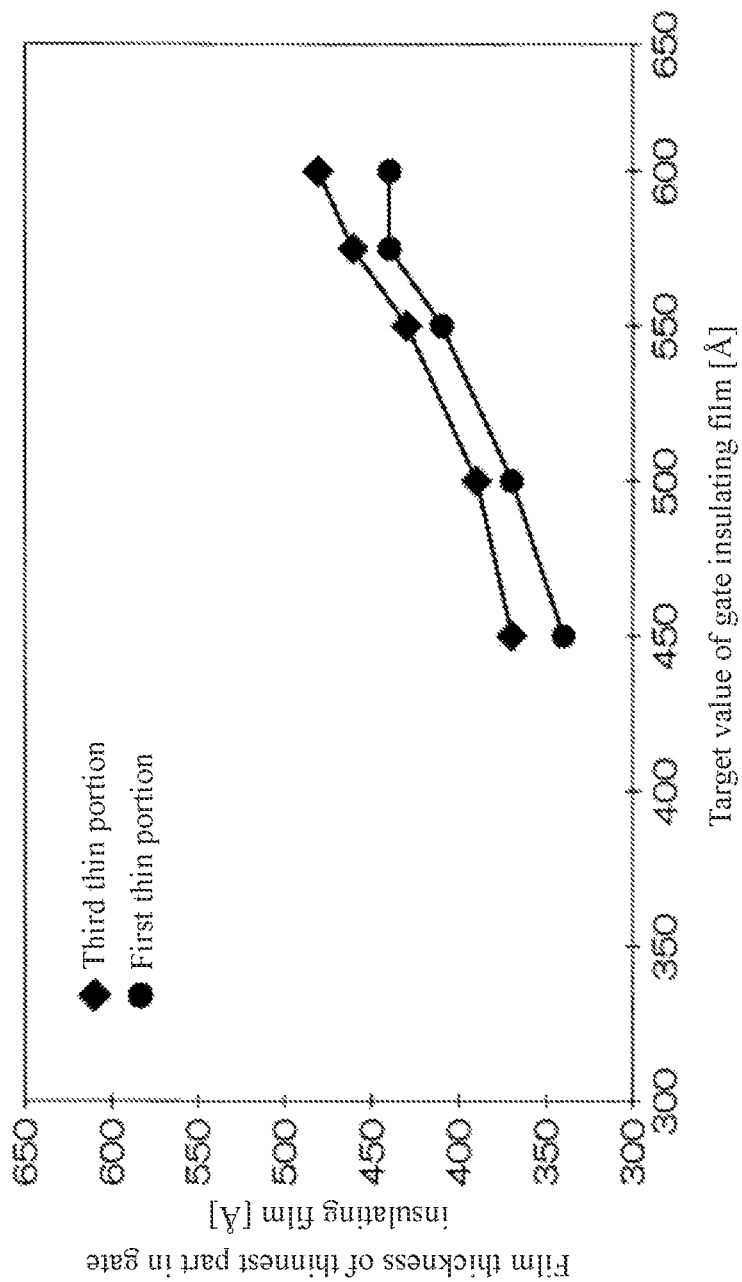
FIG. 22 is a diagram of a relation between a target value of a gate insulating film and thin portions of a gate insulating film.

FIG. 22 is a diagram of a relation between a target value of the gate insulating film 16 and the thin portions 155 and 185 of the gate insulating film 16.

In FIG. 22, the target value of the gate insulating film 16 on the horizontal axis is a target thickness of the part of the gate insulating film 16 (the first insulating film 161) facing the channel region 124 and is predetermined based on target conduction characteristics. On the other hand, the film thickness of the thinnest part of the gate insulating film 16 on the vertical axis is an actual measurement value of the part with the smallest film thickness in the first insulating film 161 and the second insulating film 162. In FIG. 22, the film thickness of the part corresponding to the first thin portion 155 and the third thin portion 185 is depicted as an example of the thinnest part.

In this example, the width $W_1$ of the gate trench 15 is set to be 0.24 μm, the width $W_2$ of the first peripheral trench 40 is set to be 0.8 μm, and silica films are formed on the inner surfaces of the trenches 15 and 40 to thereby compare with the thickness of the thinnest part. It is known from the results that, regardless of the value of the target value of the gate insulating film 16, the third thin portion 185 is consistently thicker than the first thin portion 155.

Figure 23:
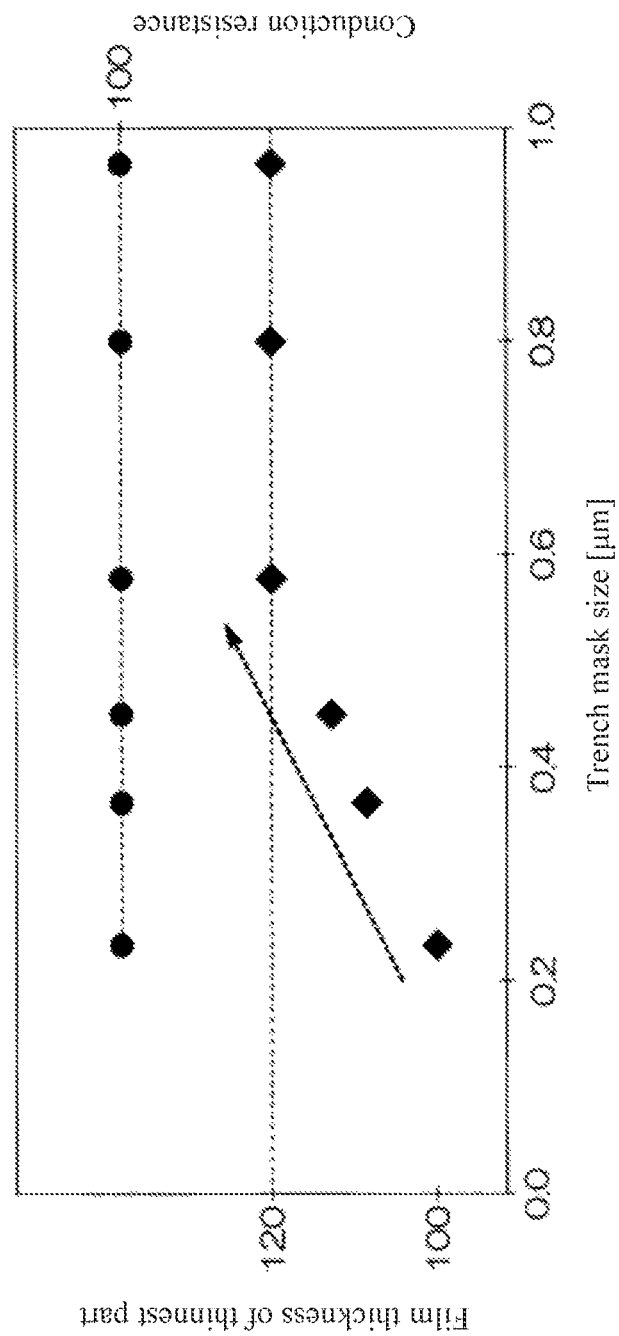
FIG. 23 is a diagram of a relation between a film thickness change of a gate insulating film (third thin portion) and a conduction resistance change.

FIG. 23 shows a diagram of a relation between a film thickness change of the gate insulating film 16 (the third thin portion 185) and a conduction resistance change.

In FIG. 23, the trench mask size on the horizontal axis represents the opening size of the mask used when forming the first peripheral trench 40, and substantially coincides with the width $W_2$ of the first peripheral trench 40. On the other hand, the film thickness of the thinnest part on the left vertical axis is the film thickness of the part in the second insulating film 162 having the smallest film thickness, and represents the film thickness of the part corresponding to the third thin portion 185. Moreover, the film thickness of the third thin portion 185 is set to be 100 when the trench mask size is 0.25 μm, and the film thicknesses of other mask sizes are represented by ratios with respect to the mask size=0.25 μm. In addition, the conduction resistance on the right vertical axis represents the conduction resistance ($V_{GS}$=10 V) when the semiconductor component 3 is turned on. Moreover, the conduction resistance is set to be 100 when the trench mask size is 0.25 μm, and the conduction resistances of other mask sizes are represented by ratios with respect to the mask size=0.25 μm.

In this example, the width $W_1$ of the gate trench 15 is set to be 0.24 μm, the width $W_2$ (mask size) of the first peripheral trench 40 is used as a variant, and silica films are formed on the inner surfaces of the trenches 15 and 40 by thermal oxidation. Then, the change accompanied with the width $W_2$ of the first peripheral trench 40 is verified to observe the changes in the film thickness and the conduction resistance of the third thin portion 185. It is known from the results that, the film thickness of the third thin portion 185 increases as the mask size (the width $W_2$ of the first peripheral trench 40) increases. More specifically, it is known that the film thickness of the third thin portion 185 is maximized (increased by about 20% when the mask size=0.25 μm) when the mask size is around 0.6 μm, and stays substantially constant even if when the mask size>0.6 μm. On the other hand, it is also known that even if the mask size is increased, the conduction resistance stays substantially constant (not increased).

An embodiment of the disclosure is described above; however, the disclosure may also be implemented in other configurations.

Figure 24:
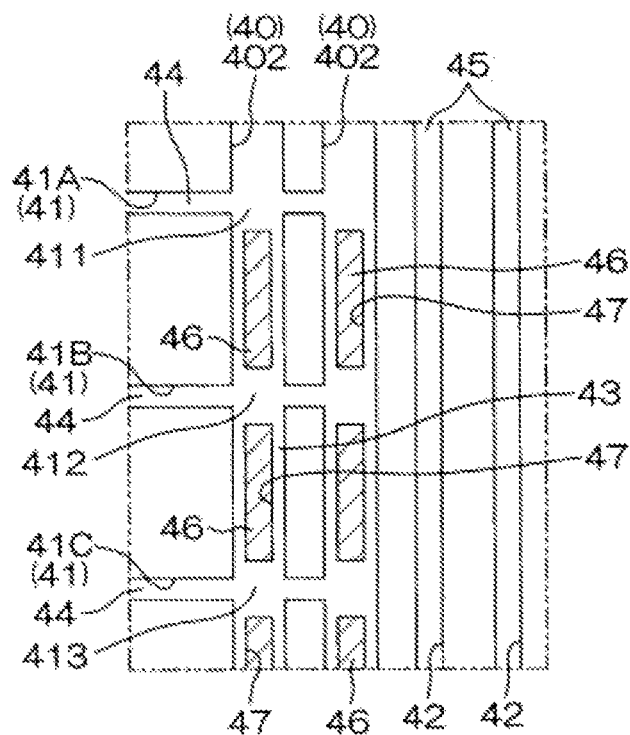
FIG. 24 is a diagram of a varied embodiment of a first peripheral trench.
Figure 25:
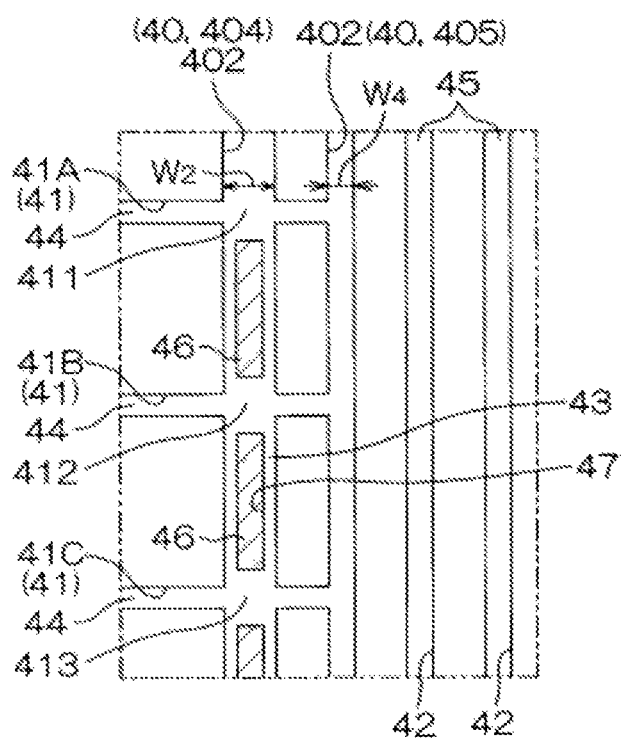
FIG. 25 is a diagram of a varied embodiment of a first peripheral trench.

For example, in the embodiment above, only one first peripheral trench 40 is formed; however, as shown in FIG. 24, a plurality of first peripheral trenches 40 (two in FIG. 24) may also be formed. Moreover, in this case, as shown in FIG. 25, the widths of the plurality of first peripheral trenches 40 may be different from one another. For example, the plurality of first peripheral trenches 40 may include a first trench 404 having a width $W_2$, and a second trench 405 having a width $W_4$ smaller than the width $W_2$.

For example, a configuration in which the conductivity type of each semiconductor part of the semiconductor device 1 is reversed can also be adopted. For example, in the semiconductor device 1, the p-type part may be n-type, and the n-type part may be p-type.

Moreover, in the embodiment above, a metal-insulation semiconductor field-effect transistor (MISFET) is used as an example of the component structure of the semiconductor device 1; however, the component structure of the semiconductor device 1 may also be implemented by an insulated gate bipolar transistor (IGBT).

Further, various design modifications may be made to implementations within the scope of the items recited in the appended claims.

The invention claimed is:

1. A semiconductor device, comprising:
a semiconductor chip having a first main surface including an active region and a peripheral region surrounding the active region;
a first trench formed in the active region;
a first insulating film formed on an inner surface of the first trench;
a first electrode formed in the first trench interfacing the first insulating film, and forming a channel in a portion of the semiconductor chip facing the first insulating film;
a second trench formed in the peripheral region and having a width greater a width of the first trench, wherein the second trench extends along a first direction and a second direction intersecting the first direction, and wherein the second trench has a corner portion curved from the first direction to the second direction;
a second insulating film formed on an inner surface of the second trench; and
a second electrode formed in the second trench interfacing the second insulating film and electrically coupled to the first electrode, wherein
the first insulating film has a first thin portion formed at the bottom of the first trench, the first thin portion being selectively thinner than other portions of the first insulating film, and wherein
the second insulating film has a second thin portion formed at the bottom of the corner portion of the second trench, the second thin portion being thinner than other portions of the second insulating film and thicker than the first thin portion.

2. The semiconductor device according to claim 1, wherein the first insulating film includes a first thin concave portion selectively recessed at the bottom of the first trench in a direction approaching the inner surface of the first trench, and
the first thin portion is sandwiched between the first thin concave portion and the inner surface of the first trench.

3. The semiconductor device according to claim 1, wherein the second insulating film includes a second thin concave portion selectively recessed at the bottom of the corner portion of the second trench in a direction approaching the inner surface of the second trench, and wherein the second thin portion is sandwiched between the second thin concave portion and the inner surface of the second trench.

4. The semiconductor device according to claim 1, further comprising:
a connecting trench straddling between the active region and the peripheral region and connecting the first trench and the second trench; and
a connection electrode formed in the connecting trench and connecting the first electrode to the second electrode.

5. The semiconductor device according to claim 4, further comprising:
an interlayer insulating film formed on the semiconductor chip and covering the first trench and the second trench;
a surface electrode formed on the interlayer insulating film; and
a contact portion formed in the interlayer insulating film and connecting the surface electrode to the second electrode.

6. The semiconductor device according to claim 5, wherein the connecting trench comprises:
a first connection trench connected to the second trench at a first connection point; and a second connection trench connected to the second trench at a second connection point separated from the first connection point, wherein the contact portion is connected to the second electrode at a portion of the second trench between the first connection portion and the second connection portion.

7. The semiconductor device according to claim 5, wherein the second electrode includes an embedded electrode and a contact hole, the embedded electrode embedded in the second trench, the contact hole penetrating the interlayer insulating film and reaching an intermediate portion of the second electrode in a depth direction of the second trench, and wherein the contact portion includes a contact plug embedded in the contact hole.

8. The semiconductor device according to claim 7, further comprising a barrier film formed between the contact plug and an inner surface of the contact hole to prevent contact among the contact plug, the interlayer insulating film and the second electrode.

9. The semiconductor device according to claim 5, wherein the surface electrode comprises:

a pad electrode portion covering the active region and configured to be electrically coupled to the channel; and a finger electrode portion formed to surround the pad electrode portion and electrically coupled to the second electrode through the contact portion.

10. The semiconductor device according to claim 1, further comprising:

a third trench formed separately from and outside the second trench in the peripheral region, the third trench having a width greater than the width of the first trench and less than the width of the second trench;

a third insulating film formed on an inner surface of the third trench; and a third electrode formed in the third trench interfacing the third insulating film, wherein the third electrode is electrically floating.

11. The semiconductor device according to claim 1, wherein the first trench has a first width substantially between about 0.17 μm and about 0.22 μm, and the second trench has a second width substantially between about 0.5 μm and about 1.0 μm.

12. The semiconductor device according to claim 1, wherein the second trench has a depth greater than a depth of the first trench.

13. The semiconductor device according to claim 1, wherein the second trench includes a plurality of trenches having different widths from each other.

14. The semiconductor device according to claim 1, wherein an inner surface portion of the second trench in contact with the second thin portion has a different surface orientation from an inner surface portion of the first trench in contact with the first thin portion.

15. The semiconductor device according to claim 1, further comprising a first conductivity type source region, a second conductivity type body region and a first conductivity type drift region sequentially formed from the first main surface of the semiconductor chip in a depth direction of the first trench, wherein the first electrode includes a gate electrode that forms the channel in the body region.

16. The semiconductor device according to claim 1, wherein the semiconductor chip includes a silicon chip.

\* \* \* \* \*